(12) United States Patent
Lou et al.

(10) Patent No.: US 11,380,262 B2
(45) Date of Patent: Jul. 5, 2022

(54) DISPLAY DEVICE HAVING A TRANSPARENT DISPLAY AREA FOR DISPLAY AND LIGHT TRANSMITTING FUNCTIONS

(71) Applicant: Yungu (Gu'an) Technology Co., Ltd., Langfang (CN)

(72) Inventors: Junhui Lou, Kunshan (CN); Fengzhang Hu, Kunshan (CN); Lu Zhang, Kunshan (CN); Zhihua Shen, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 75 days.

(21) Appl. No.: 17/005,661

(22) Filed: Aug. 28, 2020

(65) Prior Publication Data

US 2020/0394959 A1    Dec. 17, 2020

Related U.S. Application Data

(63) Continuation of application No. PCT/CN2019/092563, filed on Jun. 24, 2019.

(30) Foreign Application Priority Data

Dec. 28, 2018  (CN) .......................... 201811627702.7

(51) Int. Cl.
*G09G 3/3258* (2016.01)
*G09G 3/20* (2006.01)
(Continued)

(52) U.S. Cl.
CPC ......... *G09G 3/3258* (2013.01); *G09G 3/2003* (2013.01); *G09G 3/3266* (2013.01);
(Continued)

(58) Field of Classification Search
CPC .................................................... G09G 3/3258
(Continued)

(56) References Cited

U.S. PATENT DOCUMENTS

2014/0232722 A1  8/2014 Deluca
2016/0132148 A1  5/2016 Han et al.
(Continued)

FOREIGN PATENT DOCUMENTS

CN   106373488 A   2/2017
CN   106850897 A   6/2017
(Continued)

OTHER PUBLICATIONS

First Office Action and Search Report dated May 26, 2020, in corresponding Chinese application No. 201811627702.7; 13 pages.
(Continued)

*Primary Examiner* — Long D Pham
(74) *Attorney, Agent, or Firm* — Maier & Maier, PLLC

(57) ABSTRACT

A display device and an OLED array substrate, the OLED array substrate includes a non-transparent display area and a transparent area, wherein the non-transparent area is provided with first OLED sub-pixels arranged in a first array and the transparent display area is provided with second OLED sub-pixels arranged in a second array; the first OLED sub-pixels are driven by a part of data signal channels of a display driver integrated chip, the second OLED sub-pixels are driven by a remaining part of the data signal channels of the display driver integrated chip; data in all the data signal channels correspond to one frame of screen display in the display area; when the second OLED sub-pixels are driven, the transparent display area performs a display function; when the second OLED sub-pixels are not driven, the transparent display area performs a light transmitting function.

17 Claims, 20 Drawing Sheets

(51) Int. Cl.
*G09G 3/3266* (2016.01)
*G09G 3/3275* (2016.01)
*H01L 27/32* (2006.01)
*H01L 51/52* (2006.01)

(52) U.S. Cl.
CPC ....... *G09G 3/3275* (2013.01); *H01L 27/3218* (2013.01); *H01L 27/3262* (2013.01); *H01L 51/5203* (2013.01)

(58) Field of Classification Search
USPC .......................................................... 345/84
See application file for complete search history.

(56) References Cited

U.S. PATENT DOCUMENTS

| | | | |
|---|---|---|---|
| 2020/0052059 A1* | 2/2020 | Chen ................... | H01L 27/3244 |
| 2020/0098318 A1* | 3/2020 | Liu ....................... | G09G 3/3291 |

FOREIGN PATENT DOCUMENTS

| | | | |
|---|---|---|---|
| CN | 107340660 | A | 11/2017 |
| CN | 107564470 | A | 1/2018 |
| CN | 107610635 | A | 1/2018 |
| CN | 108257514 | A | 7/2018 |
| CN | 108336117 | A | 7/2018 |
| CN | 108364957 | A | 8/2018 |
| CN | 108365122 | A | 8/2018 |
| CN | 108365123 | A | 8/2018 |
| CN | 108376696 | A | 8/2018 |
| CN | 108389879 | A | 8/2018 |
| CN | 108632417 | A | 10/2018 |
| CN | 108717244 | A | 10/2018 |
| CN | 108983872 | A | 12/2018 |

OTHER PUBLICATIONS

International Search Report dated Oct. 8, 2019 in corresponding International application No. PCT/CN2019/092563; 5 pages.

Written Opinion of the International Searching Authority dated Oct. 8, 2019 in corresponding International application No. PCT/CN2019/092563; 6 pages.

Chinese Office Action dated Dec. 18, 2020, in connection with corresponding CN Application No. 201811627702.7 (7 pp. including machine-generated English translation).

* cited by examiner

Data signal channel

Data signal channels

DISPLAY DEVICE HAVING A TRANSPARENT DISPLAY AREA FOR DISPLAY AND LIGHT TRANSMITTING FUNCTIONS

CROSS-REFERENCE TO RELATED APPLICATIONS

This disclosure is a continuation application of International Patent Application No. PCT/CN2019/092563, filed on Jun. 24, 2019, which claims priority to Chinese Patent Application No. 201811627702.7, filed on Dec. 28, 2018, the entire content of which is incorporated herein by reference.

TECHNICAL FIELD

The present disclosure relates to the technical field of Organic Light-Emitting Diode (OLED) display devices, particularly to a display device as well as a display panel and an OLED array substrate thereof.

BACKGROUND

With the rapid development of display devices, users have increasingly higher requirements on screen-to-body ratio and full screen display has gained more and more attention from the industry. Since components such as a camera, a sensor, an earphone and the like are to be installed in the display screen, a part of the area in the display screen, for example, a front notch region of iphoneX is usually reserved for installing the above components.

SUMMARY

A display device as well as a display panel and an OLED array substrate thereof are provided in the present disclosure.

A first aspect of the present disclosure provides an OLED substrate including a display area, wherein the display area includes: a non-transparent display area and a transparent area, wherein the non-transparent area is provided with first OLED sub-pixels arranged in a first array and the transparent display area is provided with second OLED sub-pixels arranged in a second array; the first OLED sub-pixels are driven by a part of data signal channels of a display driver integrated chip, the second OLED sub-pixels are driving by a remaining part of the data signal channels of the display driver integrated chip; data in all the data signal channels correspond to one frame of screen display in the display area; and data of all the data signal channels correspond to a frame of screen display in the display area; and when the second OLED sub-pixels are driven, the transparent display area performs a display function; when the second OLED sub-pixels are not driven, the transparent display area performs a light transmitting function.

In a direction perpendicular to a plane where the OLED array substrate is located, each of the first OLED sub-pixels includes: a lower electrode, a first OLED light emitting structure disposed over the lower electrode, and an upper electrode disposed over the first OLED light emitting structure; each of the second OLED sub-pixels includes: a first electrode extending in a column direction, a second OLED light emitting structure disposed over the first electrode and extending in the column direction, and a second electrode disposed over the second OLED light emitting structure.

Optionally, the second OLED sub-pixels arranged in the second array include one row and several columns or two rows and several columns of the second OLED sub-pixels; when the second OLED sub-pixels arranged in the second array include one row and several columns of the second OLED sub-pixels, the colors of the second OLED sub-pixels in a same column are identical.

Optionally, a driving mode for the second OLED sub-pixels is active, the OLED array substrate further includes at least one pixel driving circuit corresponding to the second OLED sub-pixels.

Optionally, the OLED array substrate further includes an edge area and a transition area, the edge area is located in a peripheral area of the display area, the transition area is located between the transparent display area and the non-transparent display area; the pixel driving circuits are arranged in the non-transparent display area, the edge area or the transition area.

Optionally, the second OLED sub-pixels are sub-pixels of a same color, a driving mode for the second OLED sub-pixels is passive, and the first electrodes of the second OLED sub-pixels are connected to a same data signal channel or different signal channels of the display driver integrated chip.

Optionally, the second OLED sub-pixels include sub-pixels of different colors, a plurality of adjacent columns of the second OLED sub-pixels of different colors in one row form one second OLED pixel unit; and a driving mode for the second OLED sub-pixels is passive; the first electrodes of the second OLED sub-pixels of a same color in the columns of one row are connected to a same data signal channel or different data signal channels of the display driver integrated chip.

Optionally, the second OLED sub-pixels include sub-pixels of different colors, a plurality of adjacent columns of the second OLED sub-pixels of different colors in one row form one second OLED pixel unit; a driving mode for the second OLED sub-pixels is passive; the first electrode in each column of the second OLED sub-pixel in one row is connected to a drain of a switching transistor, sources of switching transistors in the columns of the sub-pixels of a same color in different second OLED pixel units are connected to a same data signal channel of the display driver integrated chip, gates of the switching transistors are connected to a same or different switching signals.

Optionally, the second OLED sub-pixels are sub-pixels of a same color, a driving mode for the second OLED sub-pixels is active, the first electrodes of the second OLED sub-pixels are connected to a drain of a same driving transistor in a same pixel driving circuit, and a gate of the driving transistor correspond to a same data signal channel of the display driver integrated chip.

Optionally, the second OLED sub-pixels include sub-pixels of different colors, a plurality of adjacent columns of the second OLED sub-pixels of different colors in one row form one second OLED pixel unit; a driving mode for the second OLED sub-pixels is active; the first electrodes of the sub-pixels of a same color in the columns of one row are connected to a drain of a switching transistor in a same pixel driving circuit or drains of switching transistors in different pixel driving circuits, a gate of each driving transistor correspond to a data signal channel of the display driver integrated chip.

Optionally, the pixel driving circuits corresponding to the second OLED sub-pixels have a function of compensating the threshold voltage for the driving transistor.

Optionally, switching signals for the pixel driving circuit corresponding to the second OLED sub-pixels come from a part of scanning signal channels of a GIP circuit, switching signals for a pixel driving circuit corresponding to the first OLED sub-pixels come from a remaining part of the scanning signal channels of the same GIP circuit.

Optionally, second electrodes of the second OLED sub-pixels form a planar electrode, and/or upper electrodes of the first OLED sub-pixels and the second electrodes of the second OLED sub-pixels are connected as a planar electrode.

Optionally, when the second OLED sub-pixels arranged in the second array include one row and several columns of the second OLED sub-pixels; the first electrodes and the second OLED light emitting structures of the columns of the second OLED sub-pixels extend in the column direction in a middle section of the transparent display area, or extend from a top of the transparent display area to a middle or bottom of the transparent display area in the column direction, or extend from the middle of the transparent display area to the bottom of the transparent display area in the column direction; when the second OLED sub-pixels arranged in the second array comprise two rows and several columns of the second OLED sub-pixels, the first electrodes and the OLED light-emitting structures in a first row of the second OLED sub-pixels extend in a column direction in upper and middle sections of the transparent display area, or extend in the column direction from a top of the transparent display area to an upper middle or a middle of the transparent display area; the first electrodes and the OLED light-emitting structures in a second row of the second OLED sub-pixels extend in the column direction in lower and middle sections of the transparent display area, or extend in the column direction from a bottom of the transparent display area to a lower middle or the middle of the transparent display area.

A second aspect of the present disclosure provides a display panel which includes the OLED array substrate according to any one of the above.

A third aspect of the present disclosure provides a display device which includes the display panel according to any one of the above.

In the present disclosure:

Generally, the reason why display of a transparent display area and a non-transparent display area are not synchronized is that the transparent display area and the non-transparent display area respectively use their own display drivers to provide switching signals and/or data signals, which are not related to each other.

Based on the above analysis, the present disclosure uses a same display driver integrated chip to drive the second OLED pixels in the transparent display area and the first OLED pixels in the non-transparent display area on a same display panel. That is, a part of the data signal channels in the display driver integrated chip are provided to the columns of the first OLED sub-pixels; and a remaining part of the data signal channels are provided to the columns of the second OLED sub-pixels. A number of data signal channels corresponding to the first OLED sub-pixels plus a number of data signal channels corresponding to the second OLED pixel equals to a total number of data signal channels, that is, data in all the data signal channels of the display driver integrated chip correspond to one frame of screen display in the display area. Thus, by associating the data signal channels in the display driver integrated chip, consistency of the picture and synchronization of the driving can be achieved.

2) In an alternative example, the first electrodes of the second OLED pixels in the transparent display area extend in a column direction and are arranged in one row and several columns or arranged in two rows and several columns, thereby reducing boundary of the graphic film layers, reducing PPI, and appropriately increasing parallel structure spacing, mitigating the diffraction problem during light transmission, and improving the imaging effect of the light sensor in the transparent display area.

3) The driving mode for the second OLED pixels in the transparent display area is a a) active mode or b) passive mode. That is, the transparent display area is AMOLED or PMOLED.

4) In an alternative example, for the example a) in 3), a pixel driving circuit corresponding to the second OLED pixels in the transparent display area is arranged in the non-transparent display area, an edge area, or a transition area between the transparent display area and the non-transparent display area. Compared with the example in which the pixel driving circuit is arranged in the transparent display area, the former example can further reduce the graphic film layer in the transparent display area and further mitigate the diffraction problem during light transmission.

5) In an alternative example, c) the second OLED sub-pixels in the columns are sub-pixels of a same color; or d) the second OLED sub-pixels in the columns are sub-pixels of different colors. In one row, several adjacent columns of the sub-pixels of different colors form a second OLED pixel unit. For example, c), when the transparent display area performs a display function, the transparent display area emits monochromatic light, such as red light, blue light, or green light. For example, d), compared with the pixels in the non-transparent display area, pixels in the transparent display area can be considered as pixel units in one row and several columns or two rows and several columns. As such, when the transparent display area performs the display function, the sub-pixels in each of the second OLED pixel units emit light. The display effect of the transparent display area is closer to that of the non-transparent display area.

6) In an alternative example, for a combination of examples a) and c), the first electrodes in the columns of sub-pixels of a same color are connected to a drain of a driving transistor in a same pixel driving circuit, and a gate of the driving transistor corresponds to a data signal channel of the display driver integrated chip. In another alternative example, for each column of the sub-pixels of a same color, each first electrode can be connected to a drain of a driving transistor in the pixel driving circuit, and a gate of each driving transistor corresponds to a data signal channel of the display driver integrated chip. Compared with the latter example, the former one requires less driving transistors in the pixel driving circuit and occupies a smaller area, also requires less data signal channels and wires.

For a combination of examples a) and d), the first electrode in each column of the sub-pixels of a same color in each of the second OLED pixel units is connected to a drain of the driving transistor in a same pixel driving circuit or different pixel driving circuits, and a gate of each driving transistor corresponds to a data signal channel of the display driver integrated chip. Compared with the latter example, the former one requires less driving transistors in the pixel driving circuit and occupies a smaller area also requires less data signal channels and wires.

For a combination of examples b) and c) above, the first electrodes of the columns of the sub-pixels can be connected to a same data signal channel of the display driver integrated chip. In another alternative implementation, for each column of the sub-pixels of a same color, the first electrode in each sub-pixel may be connected to a data signal channel of the display driver integrated chip. Compared with the latter example, the former one requires less driving transistors in the pixel driving circuit and less wires, and occupies a smaller area.

For a combination of examples b) and d) above, third electrodes of the columns of the sub-pixels of a same color in each of the second OLED pixel units are connected to a same data signal channel or different data signal channels of the display driver integrated chip. Compared with the latter example, the former one requires less driving transistors in the pixel driving circuit and less wires, and occupies a smaller area.

In this example, the first electrode in each column of the sub-pixels in each of the second OLED pixel units is connected to a drain of a switching transistor. A source of the switching transistor corresponding to each column of the sub-pixels of a same color in each of the second OLED pixel units is connected to a signal channel of the display driver integrated chip. Gates are connected to a same or different switching signals. When the gates are connected to a same switching signal, in addition to uniformly controlling all the sub-pixels of a same color to perform the display function or light transmission function, when the switching signal is "off", the switching signal can also control all the sub-pixels of the same color to perform the light transmission function to prevent crosstalk from adjacent sub-pixels when performing the display function.

7) In an alternative example, the pixel driving circuits corresponding to the columns of the second OLED sub-pixels have a function of compensating the threshold voltage for the driving transistors. The compensation can improve the lifetime and display uniformity of the display panel.

8) In an alternative example, the switching signals in the pixel driving circuits corresponding to the columns of the second OLED sub-pixels come from a part of scanning signal channels of a GIP circuit (one scanning signal channel for a 2T1C pixel drive circuit; two scanning signal channels for a 7T1C pixel driving). The switching signals in the pixel driving circuits corresponding to the first OLED sub-pixels come from a remaining part of the scanning signal channels of the same GIP circuit. The transparent display area and the non-transparent display area share the same GIP circuit, which can more conveniently improve the display synchronization of the two areas.

9) In an alternative example, when a group of several columns of the second OLED sub-pixels are arranged into one row, the first electrodes and the light-emitting structures of the second OLED sub-pixels extend in a column direction in a middle section of the transparent display area, or extend in the column direction from a top of the display area to a middle or bottom of the transparent display area, or extend in the column direction from the middle of the transparent display area to the bottom of the transparent display area; when the group of several columns of the second OLED sub-pixels are arranged into two rows, the first electrodes and the OLED light-emitting structures in a first row of the second OLED sub-pixels extend in the column direction in the middle section of the transparent display area, or extend in the column direction from the top of the transparent display area to a upper middle or the middle of the transparent display area; the first electrodes and the OLED light-emitting structures in a second row of the second OLED sub-pixels extend in the column direction in the middle section of the transparent display area, or extend in the column direction from the bottom of the transparent display area to a lower middle or the middle of the transparent display area;

10) In an alternative example, each column of the second OLED pixel in the transparent display area includes a first electrode, a second OLED light-emitting structure and a second electrode arranged in a direction perpendicular to the plane where the OLED array substrate is located, and second electrodes of respective second OLED pixels are interconnected to form a planar electrode. Both the first electrodes and the second OLED light emitting structures can be arranged in one row and several columns or two rows and several columns, and one second OLED light emitting structure corresponds to one first electrode, which can reduce the boundary of the graphic film layers and mitigate the diffraction problem.

DETAILED DESCRIPTION OF THE EMBODIMENTS

In order to make the above objectives, features, and advantages of the present application more obvious and understandable, the specific embodiments of the present disclosure will be described in detail below in conjunction with the accompanying drawings.

As a part of the area above the display screen is usually reserved for the installation of one or more cameras, one or more sensors, one or more earpieces and other components, the overall consistency of the screen is easy to be affected.

Figure 1:
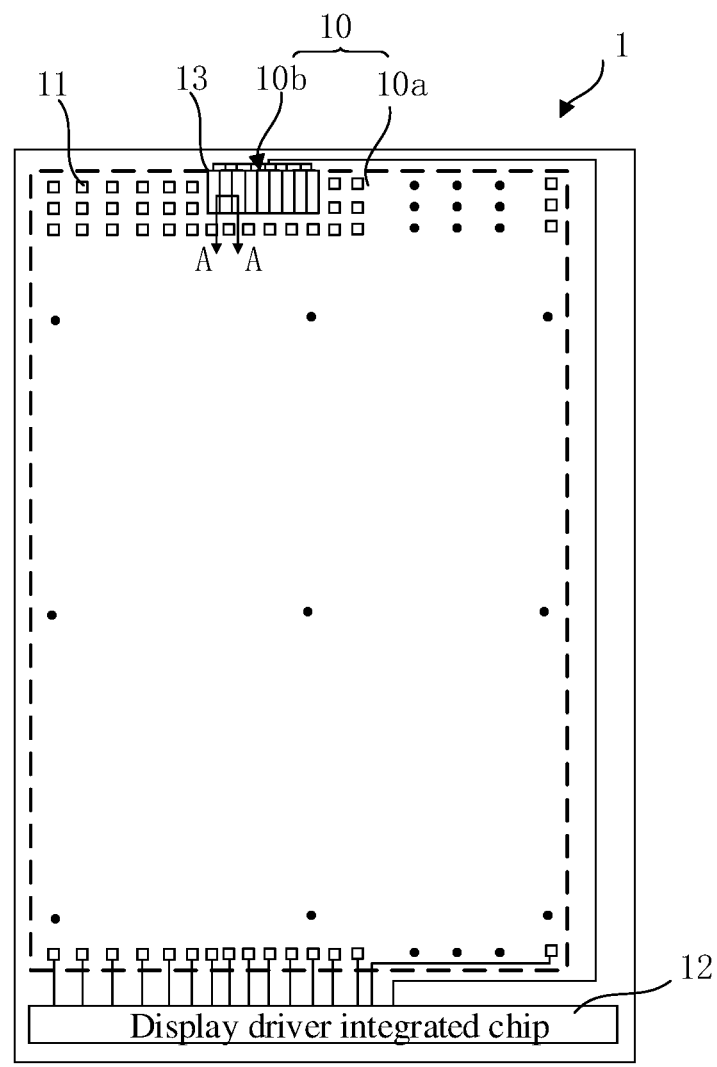
FIG. 1 is a top view of an OLED array substrate in a first example of the present disclosure.
Figure 2:
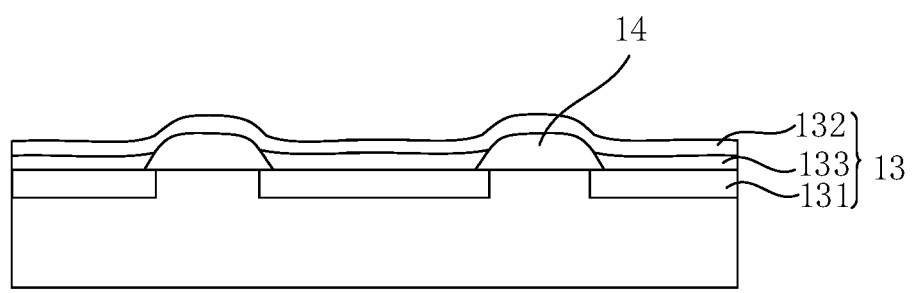
FIG. 2 is a sectional view along line A-A of FIG. 1.

FIG. 1 is a top view of an OLED (Organic Light Emitting Diode) array substrate in the first embodiment of the present disclosure; FIG. 2 is a sectional view along line A-A of FIG. 1;

Referring to FIG. 1 and FIG. 2, an OLED array substrate 1 includes a display area 10, where the display area 10 includes a non-transparent display area 10a, and a transparent display area 10b.

The non-transparent display area 10a includes first OLED sub-pixels 11 arranged in a first array. In a direction perpendicular to a plane where the OLED array substrate 1 is located, each of the first OLED sub-pixels 11 includes: a lower electrode, a first OLED light emitting structure disposed over the lower electrode and extending in a column direction, and an upper electrode disposed over the first OLED light emitting structure. The lower electrode of the first OLED sub-pixel 11 is disposed close to the OLED array substrate 1. The columns of first OLED sub-pixels 11 are driven by a part of the data signal channels of a display driver integrated chip 12.

The transparent display area 10b includes second OLED sub-pixels 13 arranged in a second array. In a direction perpendicular to the plane where the OLED array substrate 1 is located, each of the second OLED sub-pixels 13 includes: a first electrode extending in a column direction, a second OLED light emitting structure disposed over the first electrode and extending in the column direction and a second electrode disposed over the second OLED light emitting structure. When columns of the second OLED sub-pixels 13 are driven, the transparent display area 10b performs a display function. When the columns of the second OLED sub-pixels 13 are not driven, the transparent display area 10b performs a light transmission function. The columns of the second OLED sub-pixels 13 are driven by a remaining part of the data signal channels of the display driver integrated chip 12. The data of all the data signal channels corresponding to the driving for the columns of first OLED sub-pixels 11 and the columns of second OLED sub-pixels 13 correspond to one frame of screen display in the display area 10. The second OLED sub-pixels 13 arranged in the second array include one row and several columns or two rows and several columns of the second OLED sub-pixels.

Referring to FIG. 2, each of the second OLED sub-pixels 13 includes: a first electrode 131 extending in a column direction, a second OLED light emitting structure 133 and a second electrode 132. The OLED light emitting structures 133 are separated by pixel definition layers 14. The structure of the first OLED sub-pixel 11 is the same as the structure of the second OLED sub-pixel 13. In other optional examples, there may be no pixel definition layer 14 between the second OLED light emitting structures 133.

The difference between the second OLED sub-pixel 13 and the first OLED sub-pixel 11 is that for the columns of the first OLED sub-pixels 11, the lower electrodes, the first OLED light emitting structures and the upper electrodes are arranged in a first array of several rows and several columns and spaced apart in the non-transparent display area 10a. For the columns of the second OLED sub-pixels 13 arranged in a second array, the first electrodes 131 and the second OLED light emitting structures 133 extend from a top of the transparent display area 10b to a bottom of the transparent display area 10b in a column direction. For the columns of the second OLED sub-pixels 13, the second electrodes 132 may extend from the top of the transparent display area 10b to the bottom in the column direction, or the second electrodes 132 of the second OLED sub-pixels 13 in the columns are interconnected to form a planar electrode as shown in FIG. 2, and/or the upper electrodes in the first OLED sub-pixels and the second electrodes in the second OLED sub-pixels are interconnected to form a planar electrode.

In FIGS. 1 and 2, all the second OLED sub-pixels 13 in the transparent display area 10b are sub-pixels of a same color. Optionally, all the second OLED sub-pixels 13 in the transparent display area 10b can be one of red sub-pixels, green sub-pixels, blue sub-pixels, or yellow sub-pixels. In other words, when the transparent display area 10b performs the display function, the area emits monochrome light.

In other alternative examples, the arrangement of the first electrodes 131 and the second OLED light emitting structures 133 in the second OLED sub-pixels 13 may also be set to be completely the same as that of the first OLED sub-pixels 11. Compared with the arrangement of the first OLED sub-pixels 11 in a first array with several rows and several columns and away from each other, the arrangement of the first electrodes 131 and the second OLED light emitting structures 133 of the second OLED sub-pixels 13 in the transparent display area 10b in one row and several columns or two row and several columns extending in the column direction can shorten the boundary of the graphic film layers and mitigate the diffraction problem during light transmission.

A light-emitting driving mode for each second OLED sub-pixel 13 in the transparent display area 10b may be an active mode or a passive mode.

In a Passive Matrix OLED (PMOLED), also known as passively driven OLED, the second electrodes and the first electrodes are simply arranged into an array, and pixels at intersecting points of rows and columns in the array are lighted up in a scanning manner, each pixel is operated in a short pulse mode and emits instantaneously light of high brightness. In other words, the addressing of each second OLED sub-pixel 13 is directly controlled by an external circuit. The external circuit may be controlled by a Display Driver Integrated Circuit (DDIC).

An Active Matrix OLED, AMOLED, also known as actively driven OLED, includes a thin film transistor (TFT) array. Each thin film transistor in the thin film transistor array includes a storage capacitor. AMOLED uses independent thin film transistors to control the light emission of each pixel. Each pixel can emit light continuously. In other words, the addressing of each second OLED sub-pixel 13 is directly controlled by the thin film transistor array. Row selection signals of the thin film transistor array may come from a GIP (Gate In Panel) circuit, and column selection signals may come from a display driver integrated chip (DDIC).

Figure 3:
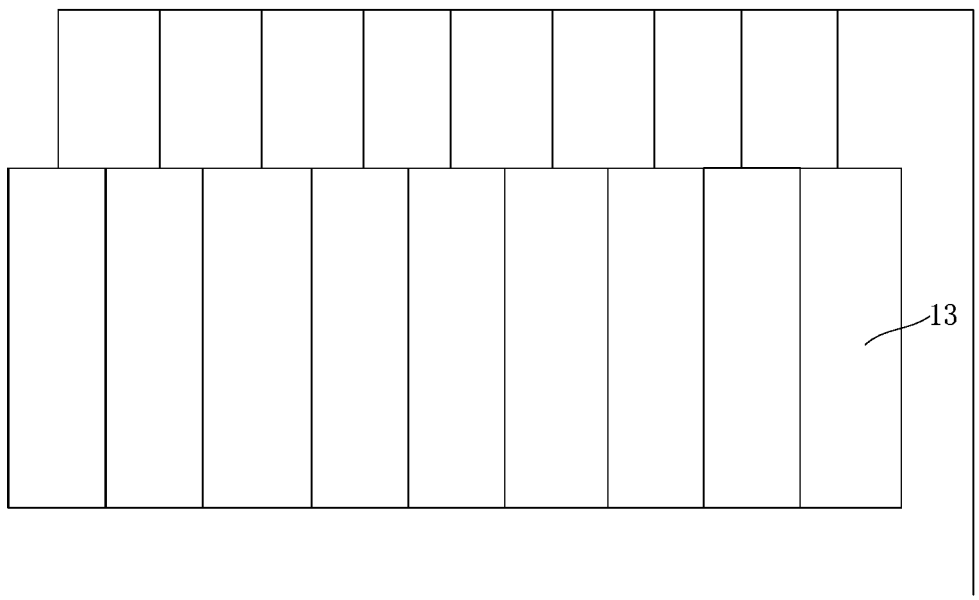
FIG. 3 is a schematic diagram of a type of a passive driving circuit for the columns of second OLED sub-pixels in the transparent display area.

FIG. 3 is a schematic diagram of a type of a passive driving circuit for the columns of second OLED sub-pixels 13 in the transparent display area. Referring to FIG. 1 and FIG. 3, the first electrodes of the second OLED sub-pixels 13 are connected to a same data signal channel of the display driver integrated chip 12 and the second electrodes of the second OLED sub-pixels are grounded. Color data carried by the data signal channel is consistent with a color of the second OLED sub-pixels 13. In other words, since the transparent display area 10b has only one row of second OLED sub-pixels 13, only a same driving current is to be applied to the columns of second OLED sub-pixels 13, where the driving current occupies one data signal channel of the display driver integrated chip (DDIC). The remaining data signal channels of the display driver integrated chip may be provided to the columns of the first OLED sub-pixels 11 in the non-transparent display area 10a, that is, each column of the first OLED sub-pixels 11 occupies one data signal channel.

A sum of a number of data signal channels occupied by the non-transparent display area 10a and one data signal channel occupied by the transparent display area 10b, is a total number of data signal channels, that is, data of all data signal channels corresponds to one frame of screen display in the display area 10, which refers to t, in an image refresh cycle, the data of the data channels comes from processing one image.

Figure 4:
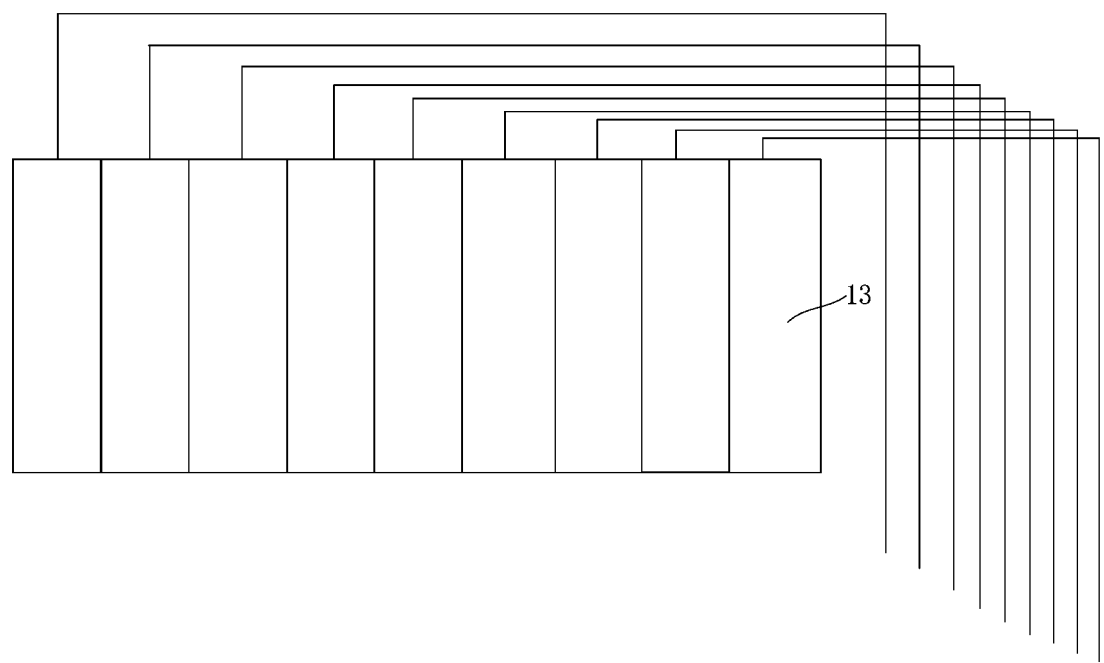
FIG. 4 is a schematic diagram of another type of the passive driving circuit for the columns of second OLED sub-pixels in the transparent display area, in which the first electrodes in the columns of the second OLED sub-pixels are connected to different data signal channels of the display driver integrated chip.

FIG. 4 is a schematic diagram of another type of the passive driving circuit for the columns of second OLED sub-pixels in the transparent display area. Referring to FIG. 4, the first electrodes in the columns of the second OLED sub-pixels 13 are connected to different data signal channels of the display driver integrated chip 12, and the second electrodes of the second OLED sub-pixels 13 are grounded. The color data carried by each data signal channel is consistent with the color of the second OLED sub-pixel 13 in the connected column. In other words, since the transparent display area has one row of the second OLED sub-pixels 13, driving currents are to be applied to the respective second OLED sub-pixels 13. The driving currents for the columns of second OLED sub-pixels 13 occupy a plurality of data signal channels (source lines) of the display driver integrated chip (DDIC), that is, each column of the second OLED sub-pixel 13 occupies one data signal channel. The remaining data signal channels of the display driver integrated chip may be provided to the columns of the first OLED sub-pixels 11 in the non-transparent display area 10a, that is, each column of the first OLED sub-pixels 11 occupies one data signal channel.

A sum of a number of data signal channels occupied by the non-transparent display area 10a and a number of data signal channels occupied by the transparent display area 10b is a total number of data signal channels. Data of all data signal channels corresponds to one frame of screen display in the display area 10.

In the examples of FIG. 3 and FIG. 4, the wiring of the first electrodes in the second OLED sub-pixels 13 is arranged in an edge area on the OLED array substrate 1, where the edge area is located in a peripheral area of the display area 10. In other alternative examples, the wiring of the first electrodes can also be arranged in the non-transparent display area 10a or the transparent display area 10b. Compared with the example in which the wiring is arranged in the transparent display area 10b, the example in which the wiring is arranged in the edge area and/or the non-transparent display area 10a can further reduce the number of graphic film layers in the transparent display area 10b and further mitigate the diffraction problem under the light transmission mode.

Compared with the example shown in FIG. 4, in the example shown in FIG. 3, the number of data signal channels can be less, the number of wires connecting the data signal channels and the sub-pixels can also be less, and the occupied area can be smaller.

Figure 5:
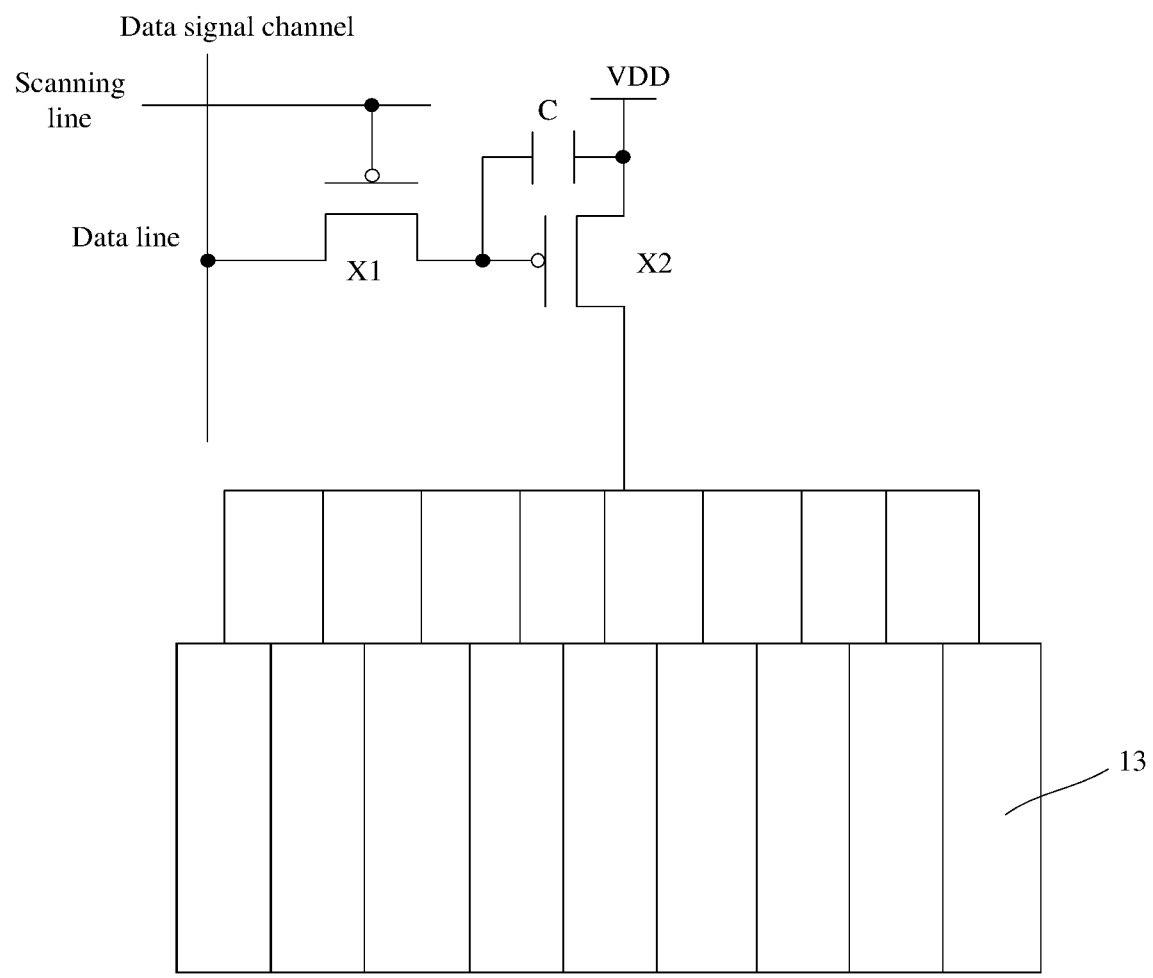
FIG. 5 is a schematic diagram of a type of an active driving circuit for the columns of second OLED sub-pixels in the transparent display area.

FIG. 5 is a schematic diagram of a type of an active driving circuit for the columns of second OLED sub-pixels 13 in the transparent display area. Referring to FIG. 5, the first electrodes of the second OLED sub-pixels 13 are connected to a drain of a same driving transistor in a pixel driving circuit, and the second electrodes of the second OLED sub-pixels 13 are grounded. A gate of the driving transistor corresponds to a same data signal channel of the display driver integrated chip (DDIC). A source of the driving transistor is connected to a power supply voltage VDD. In FIG. 5, the pixel driving circuit includes a switching transistor X1, a driving transistor X2, and a storage capacitor C. A data line can be connected to a data signal channel (source line) of the display driver integrated chip (DDIC); and a scanning line can be connected to a scanning signal channel of a GIP circuit. The remaining data signal channels of the display driver integrated chip may be provided to the columns of the first OLED sub-pixels 11 in the non-transparent display area 10a, where each column of the first OLED sub-pixels 11 occupies one data signal channel. The remaining scanning signal channels of the GIP circuit may be provided to the rows of the first OLED sub-pixels 11 in the non-transparent display area 10a, where each row of the first OLED sub-pixels 11 occupies one scanning signal channel.

A sum of a number of data signal channels occupied by the non-transparent display area 10a and one data signal channel occupied by the transparent display area 10b, is a total number of data signal channels, that is, data of all data signal channels corresponds to one frame of screen display in the display area 10.

Figure 6:
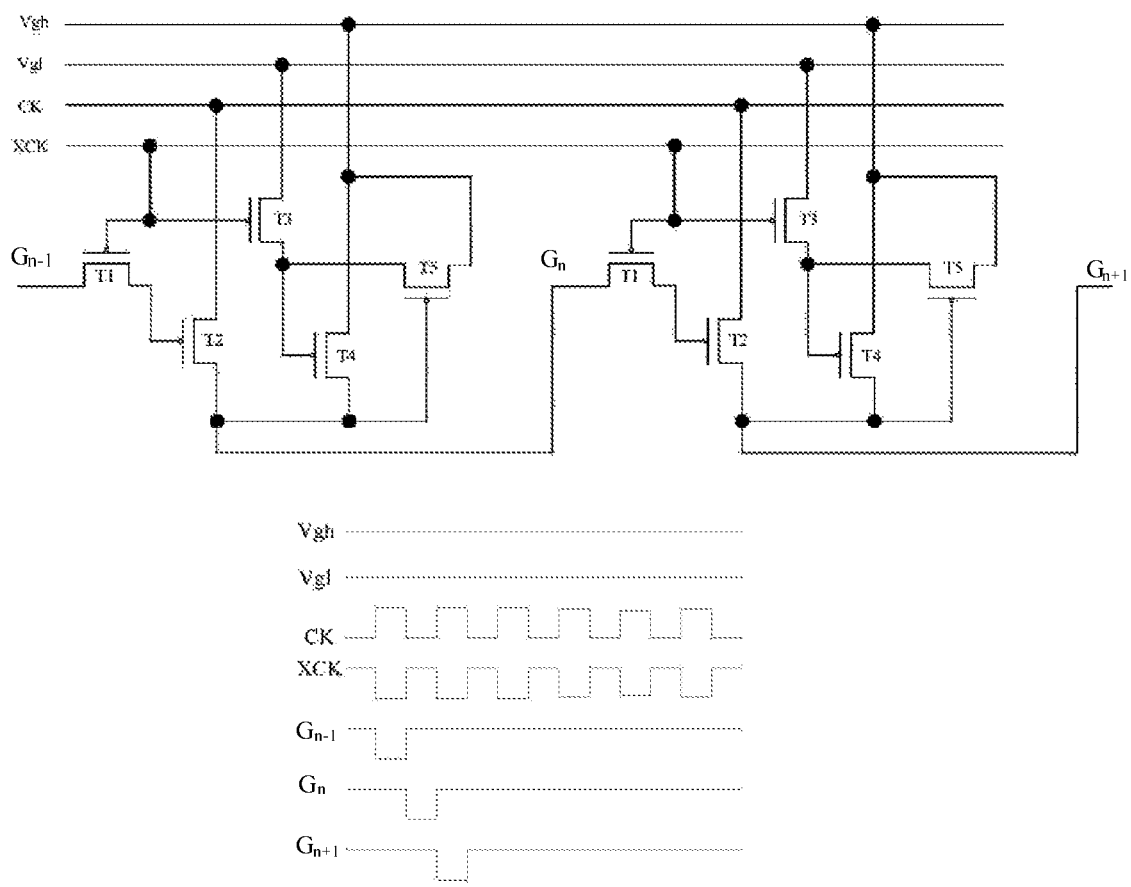
FIG. 6 is a schematic diagram of structure and timing of a GIP circuit.

FIG. 6 is a schematic diagram of structure and timing of a GIP circuit. Referring to FIG. 6, a GIP circuit includes a first transistor T1, a second transistor T2, a third transistor T3, a fourth transistor T4, and a fifth transistor T5. A first clock signal line XCK is connected to a gate of the first transistor T1 and a gate of the third transistor T3. A second clock signal line CK is connected to a source of the second transistor T2. A first gate line Vgh is connected to a source of the fourth transistor T4 and a source of the fifth transistor T5, and a second gate line Vgl is connected to a source of the third transistor T3. The OLED array substrate 1 may include multiple level of GIP circuits, where a source of the first transistor T1 in the n-th level GIP circuit is connected to an input signal line $G_n$ as an input signal for the n-th level circuit. A drain of the second transistor T2 in the n-th level GIP circuit is connected to an output signal line of the n-th level GIP circuit, and the output signal of the n-th level GIP circuit is used as the input signal $G_{n+1}$ of the (n+1)-th level GIP circuit.

Referring to the waveform diagram driven by the GIP circuit in FIG. 6, the first gate line Vgh is at a high level, the second gate line Vgl is at a low level. The first clock signal line XCK and the second clock signal line CK output digital signals with opposite high and low levels respectively. When the first clock signal line XCK jumps to a low level, input signal line G1 of the first level GIP circuit inputs a low level. When the second clock signal line CK jumps to a low level, the first level GIP circuit outputs a low level as an input signal G2 for the second level GIP circuit, and the like. The output signal of the n-th level GIP circuit is used as the input signal for the (n+1)-th level GIP circuit.

Figure 7:
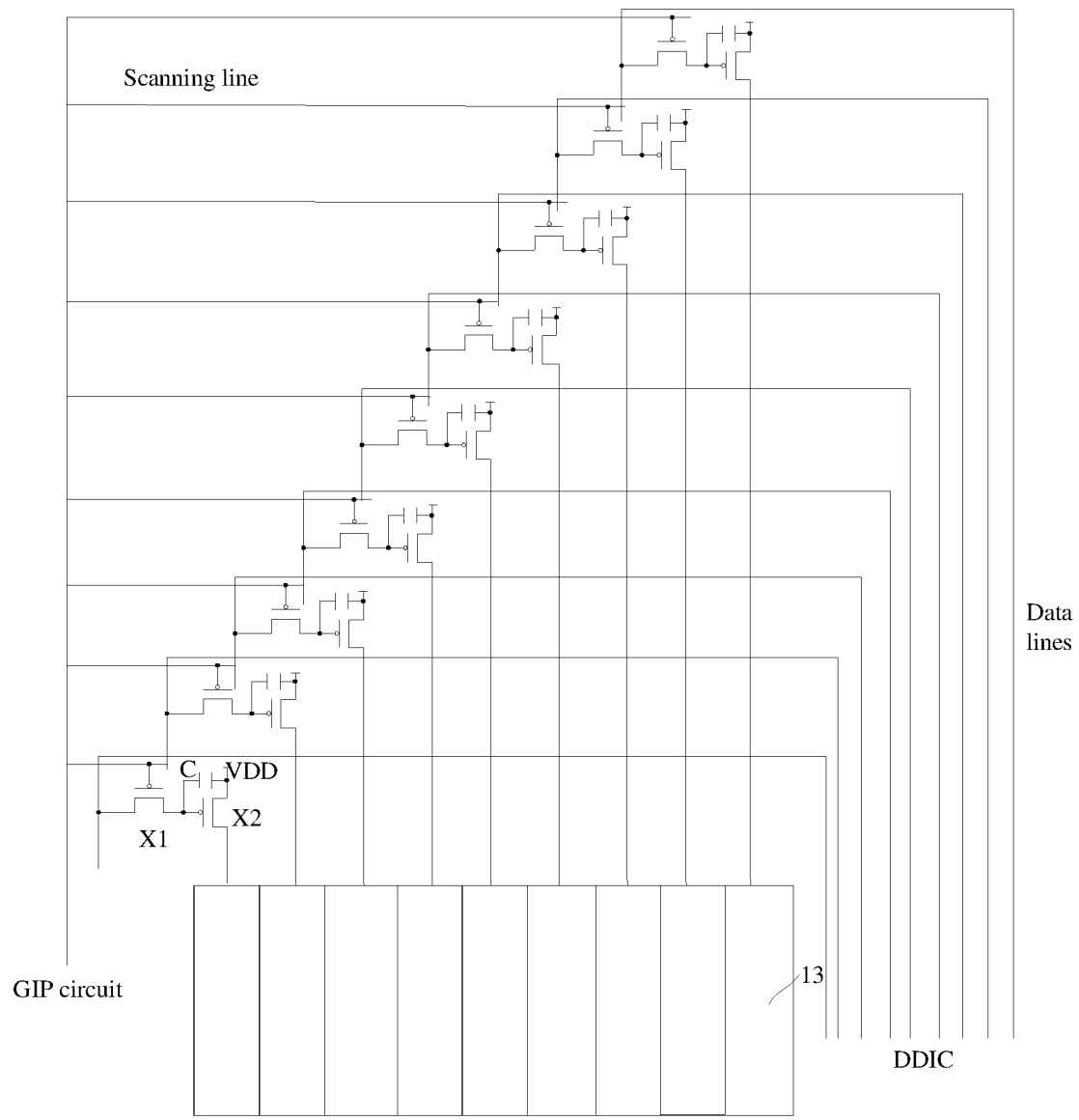
FIG. 7 is a schematic diagram of another type of the active driving circuit for the columns of second OLED sub-pixels in the transparent display area; in which the first electrodes in the columns of the second OLED sub-pixels are connected to drains of different driving transistors in a pixel driving circuit.

FIG. 7 is a schematic diagram of another type of the active driving circuit for the columns of second OLED sub-pixels 13 in the transparent display area. Referring to FIG. 7, the first electrodes in the columns of the second OLED sub-pixels 13 are connected to drains of different driving transistors in a pixel driving circuit. The second electrodes of the second OLED sub-pixels 13 are grounded. A gate of each driving transistor corresponds to a data signal channel of the display driver integrated chip. A source of each driving transistor corresponds to a power supply voltage VDD. In FIG. 7, a pixel driving circuit includes a transistor array, where a transistor unit in the transistor array includes: a switching transistor X1, a driving transistor X2, and a storage capacitor C. That is, each transistor unit includes 2T1C. A data line in each transistor unit can be connected to a data signal channel (source line) of the display driver integrated chip (DDIC). The scanning lines of the transistor units can be jointly connected to a scanning signal channel of the GIP circuit. In other words, each transistor unit occupies a data signal channel of the display driver integrated chip, and all the transistor units jointly occupy a scanning signal channel of the GIP circuit. The remaining data signal channels of the display driver integrated chip may be provided to the columns of the first OLED sub-pixels 11 in the non-transparent display area 10a, where each column of the first OLED sub-pixels 11 occupies one data signal channel. The remaining scanning signal channels of the GIP circuit may be provided to the rows of the first OLED sub-pixels 11 in the non-transparent display area 10a, that is, each row of the first OLED sub-pixels 11 occupies one scanning signal channel.

A sum of a number of data signal channels occupied by the non-transparent display area 10a and a number of data signal channels occupied by the transparent display area 10b is a total number of data signal channels, that is, the data of all data signal channels corresponds to one frame of screen display in the display area 10.

Figure 8A:
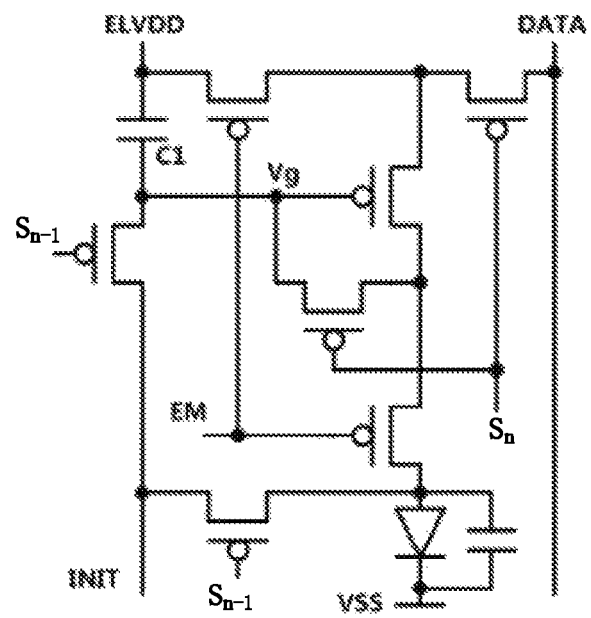
FIG. 8A is a circuit diagram and timing diagram of a pixel driving circuit with a function of compensating the threshold voltage for the driving transistor.
Figure 8B:
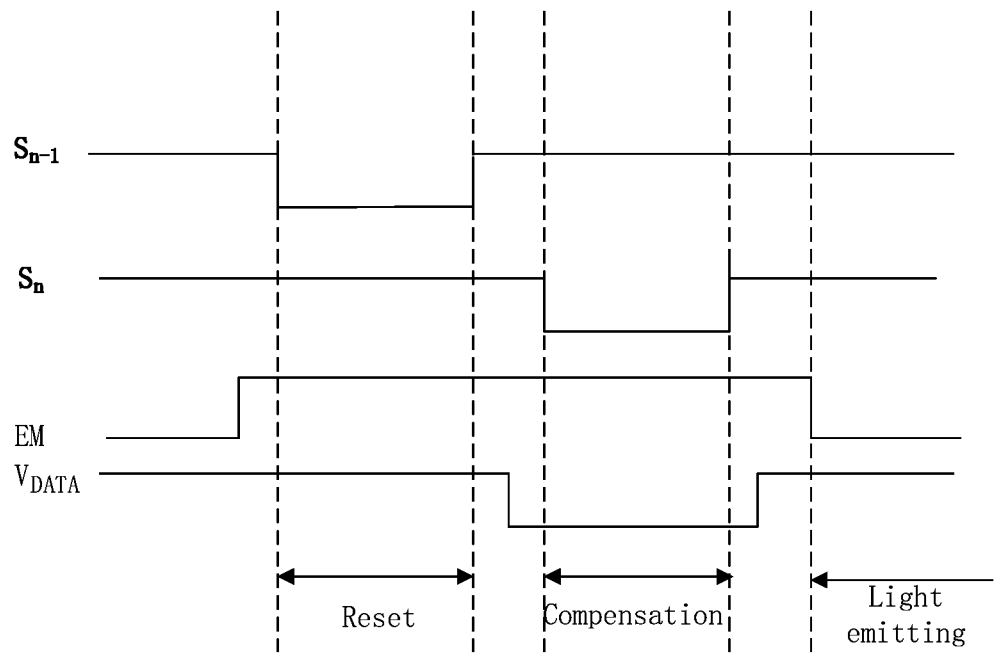
FIG. 8B is a circuit diagram and timing diagram of a pixel driving circuit with a function of compensating the threshold voltage for the driving transistor.

FIGS. 8A and 8B are circuit diagram and timing diagram of a pixel driving circuit with a function of compensating the threshold voltage for the driving transistor. During operation process, in addition to the aforementioned 2T1C, the pixel driving circuit may also be a pixel driving circuit that compensates threshold voltage for driving transistor, such as 7T1C, and 6T1C. The operation of the 7T1C pixel driving circuit shown in FIG. 8A is divided into three working stages (FIG. 8B): a reset stage, a compensation stage, and a light-emitting stage. The operation process is: at the compensation stage, the threshold voltage Vth of the driving transistor is stored in its gate-source voltage Vgs, and at the light-emitting stage, Vgs-Vth is converted into current. Because Vgs already contains Vth, when converting into current, the effect of Vth is cancelled out, thus achieving current consistency. The above circuit can improve the lifetime and display uniformity of the second OLED sub-pixels 13.

In the case that the first electrodes of the second OLED sub-pixels 13 are connected to the drain of a same driving transistor in a pixel driving circuit, the gate of the driving transistor corresponds to a data signal channel of the display driver integrated chip, and the source corresponds to a power supply voltage: signals of the data line $V_{DATA}$ of the above pixel driving circuit may come from a data signal channel (source line) of the display driver integrated chip (DDIC); signals $S_{n-1}$ and $S_n$ of the scanning lines may come from two scanning signal channels of the GIP circuit; the emission signals EM may come from an emission signal channel of the GIP circuit; and the initial signal INIT may come from the display driver integrated chip. The remaining data signal channels of the display driver integrated chip may be provided to the columns of the first OLED sub-pixels 11 in the non-transparent display area 10a, that is, each column of the first OLED sub-pixels 11 occupies one data signal channel. The remaining scanning signal channels of the GIP circuit may be provided to the rows of the first OLED sub-pixels 11 in the non-transparent display area 10a, that is, each row of the first OLED sub-pixels 11 occupies two scanning signal channels, and adjacent two rows of the first OLED sub-pixels 11 have one common scanning signal channel. The remaining emission signal EM channels of the GIP circuit may be provided to the rows of the first OLED sub-pixels 11 in the non-transparent display area 10a, that is, each row of the first OLED sub-pixels 11 occupies one emission signal EM channel.

In the case that the first electrodes of the second OLED sub-pixels 13 are connected to the drains of different driving transistors in a pixel driving circuit, the gate of each driving transistor corresponds to a data signal channel of the display driver integrated chip, and sources of the driving transistors correspond to a same power supply voltage or different power supply voltages: signals of the data line $V_{DATA}$ of the above pixel driving circuit of each column of second OLED sub-pixel may come from a data signal channel (source line) of the display driver integrated chip (DDIC); signals $S_{n-1}$ and $S_n$ of the scanning lines may come from two scanning signal channels of the GIP circuit; the emission signal EM may come from an emission signal channel of the GIP circuit; and the initial signal INIT may come from the display driver integrated chip. The data line signals $V_{DATA}$ of the pixel driving circuits for the columns of the second OLED sub-pixels 13 may come from multiple data signal channels (source lines) of the display driver integrated chip (DDIC); the signals $S_{n-1}$ and $S_n$ of the scanning lines may come from two scanning signal channels of the GIP circuit, the emission signal EM may come from one emission signal channel of the GIP circuit.

The remaining data signal channels of the display driver integrated chip may be provided to the columns of the first OLED sub-pixels 11 in the non-transparent display area 10a, that is, each column of the first OLED sub-pixels 11 occupies one data signal channel. The remaining scanning signal channels of the GIP circuit may be provided to the rows of the first OLED sub-pixels 11 in the non-transparent display area 10a, that is, each row of the first OLED sub-pixels 11 occupies two scanning signal channels, and adjacent two rows of the first OLED sub-pixels 11 have one common scanning signal channel. The remaining emission signal EM channels of the GIP circuit may be provided to the rows of the first OLED sub-pixels 11 in the non-transparent display area 10a, that is, each row of the first OLED sub-pixels 11 occupies one emission signal EM channel.

In the examples of FIG. 5 and FIG. 7, the wiring and pixel driving circuits corresponding to the columns of the second OLED sub-pixels 13 are arranged in an edge area on the OLED array substrate 1, where the edge area is located in a peripheral area of the display area 10. In other alternative examples, they can also be arranged in the non-transparent display area 10a or the transparent display area 10b. Compared with the example in which the wiring and pixel driving circuits are arranged in the transparent display area 10b, the example in which the wiring and pixel driving circuits are arranged in the edge area and/or the non-transparent display area 10a can further reduce the number of graphic film layers in the transparent display area 10b and further mitigate the diffraction problem under the light transmission mode.

Compared with the example shown in FIG. 7, in the example shown in FIG. 5, the number of data signal channels and scanning signal channels can be less, the number of wires can also be less, and the occupied area can be smaller.

Figure 9:
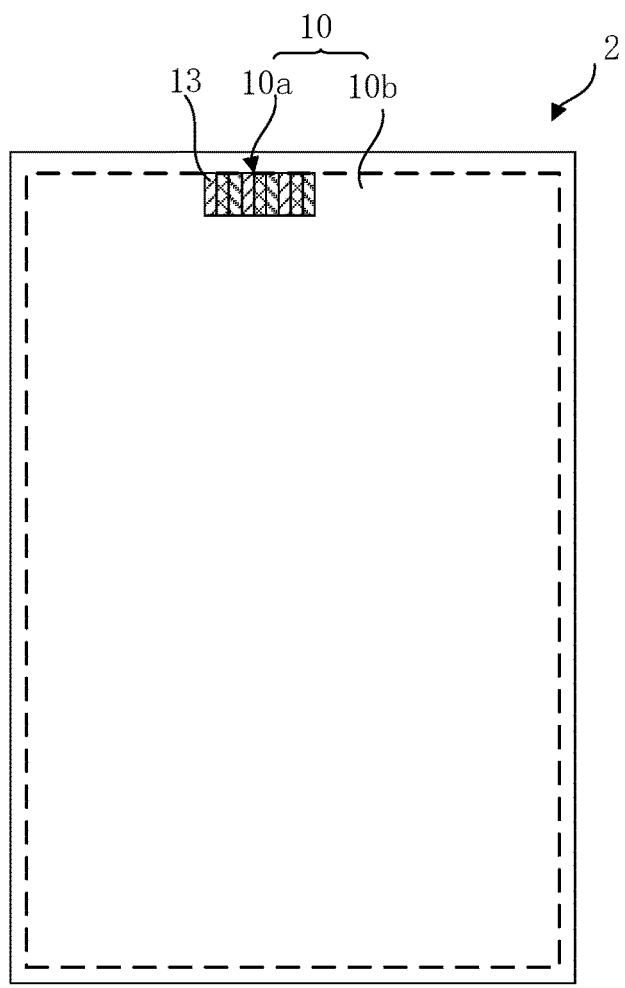
FIG. 9 is a top view of an OLED array substrate in a second example of the present disclosure, in which the columns of the second OLED sub-pixels are second OLED sub-pixels of different colors, and several adjacent columns of the second OLED sub-pixels of different colors form a second OLED pixel unit.

FIG. 9 is a top view of an OLED array substrate 2 in a second example of the present disclosure. The OLED array substrate 2 shown in FIG. 9 is substantially the same as the OLED array substrate 1 shown in FIG. 1. The difference of them is that the columns of the second OLED sub-pixels 13 are second OLED sub-pixels of different colors, and several adjacent columns of the second OLED sub-pixels 13 of different colors form a second OLED pixel unit. In other words, a column of red sub-pixel, a column of green sub-pixel, and a column of blue sub-pixel are alternately distributed in a second OLED pixel unit. In other alternative examples, colors of the second OLED sub-pixels in the second OLED pixel unit may also be colors other than red, green, and blue.

For the specific structure of the second OLED sub-pixels 13, reference may be made to the specific structure in the above example. The following will focus on difference between a driving mode for the second OLED sub-pixels of different colors and a driving mode for the second OLED sub-pixels of a same color.

Figure 10:
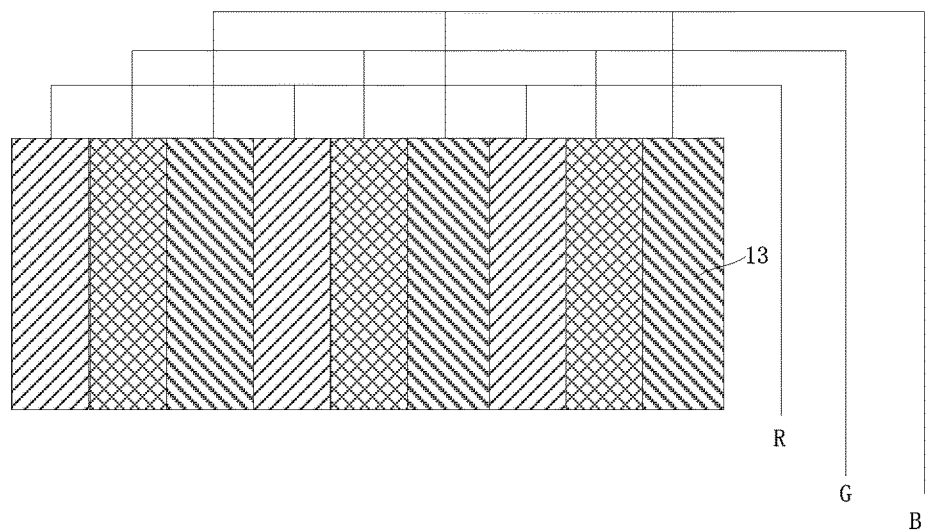
FIG. 10 is a schematic diagram of a type of a passive driving circuit for the columns of second OLED sub-pixels in the transparent display area.

FIG. 10 is a schematic diagram of a type of a passive driving circuit for the columns of second OLED sub-pixels 13 in the transparent display area. Referring to FIG. 10, the first electrodes of sub-pixels of a same color in each of the second OLED pixel units are connected to a same data signal channel of the display driver integrated chip, and the second electrodes thereof are grounded. In other words, the first electrodes of all red sub-pixels are connected to a same R data signal channel; the first electrodes of all green sub-pixels are connected to a same G data signal channel; and the first electrodes of all blue sub-pixels are connected to a same B data signal channel. Since the transparent display area 10b has only one row and three columns of the second OLED pixel units, only a same driving current is to be applied to the columns of the second OLED sub-pixels 13 of the same color and the driving currents are from three data signal channels (source lines) of the display driver integrated chip (DDIC). The remaining data signal channels of the display driver integrated chip may be provided to the columns of the first OLED sub-pixels 11 in the non-transparent display area 10a, where each column of the first OLED sub-pixels 11 occupies one data signal channel.

A sum of the multiple data signal channels occupied by the non-transparent display area 10a and the three data signal channels occupied by the transparent display area 10b is a total number of data signal channels. Data of all data signal channels corresponds to one frame of screen display in the display area 10.

Figure 11:
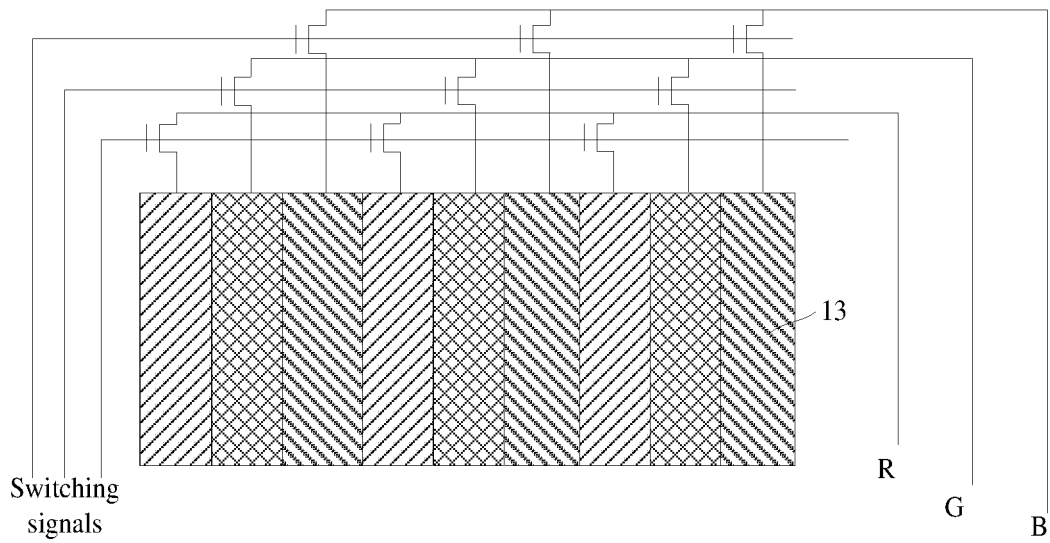
FIG. 11 is a schematic diagram of another type of the passive driving circuit for the columns of second OLED sub-pixels in the transparent display area, in which the first electrode in each column of the sub-pixels in each second OLED pixel unit is connected to a drain of a switching transistor.

FIG. 11 is a schematic diagram of another type of the passive driving circuit for the columns of second OLED sub-pixels 13 in the transparent display area. Referring to FIG. 11, the second electrodes in the columns of sub-pixels in each second OLED pixel unit are grounded, the first electrode in each column of the sub-pixels in each second OLED pixel unit is connected to a drain of a switching transistor, the sources of the switching transistors corresponding to the columns of the sub-pixels of a same color in each of the second OLED pixel units are connected to a same data signal channel of the display driver integrated chip, and the gates of the switching transistors corresponding to the columns of the sub-pixels of a same color in each of the second OLED pixel units are connected to a same switching signal. In addition to uniformly controlling all the sub-pixels of a same color to perform the display function, when the switching signal is "off", the switching signal can also control all the sub-pixels of the same color to perform the light transmission function to prevent crosstalk from adjacent sub-pixels of different colors when performing the display function.

In other alternative examples, the first electrode in each column of the second OLED sub-pixel in each second OLED pixel unit is connected to a drain of a driving transistor, sources of the switching transistors corresponding to the columns of sub-pixels of a same color in the second OLED sub-pixel units are connected to a same data signal channel of the display driver integrated chip, and the gates are connected to different switching signals. The above structure enables the sub-pixels of the same color in each column to be individually controlled to perform the display function or the light transmission function.

Figure 12:
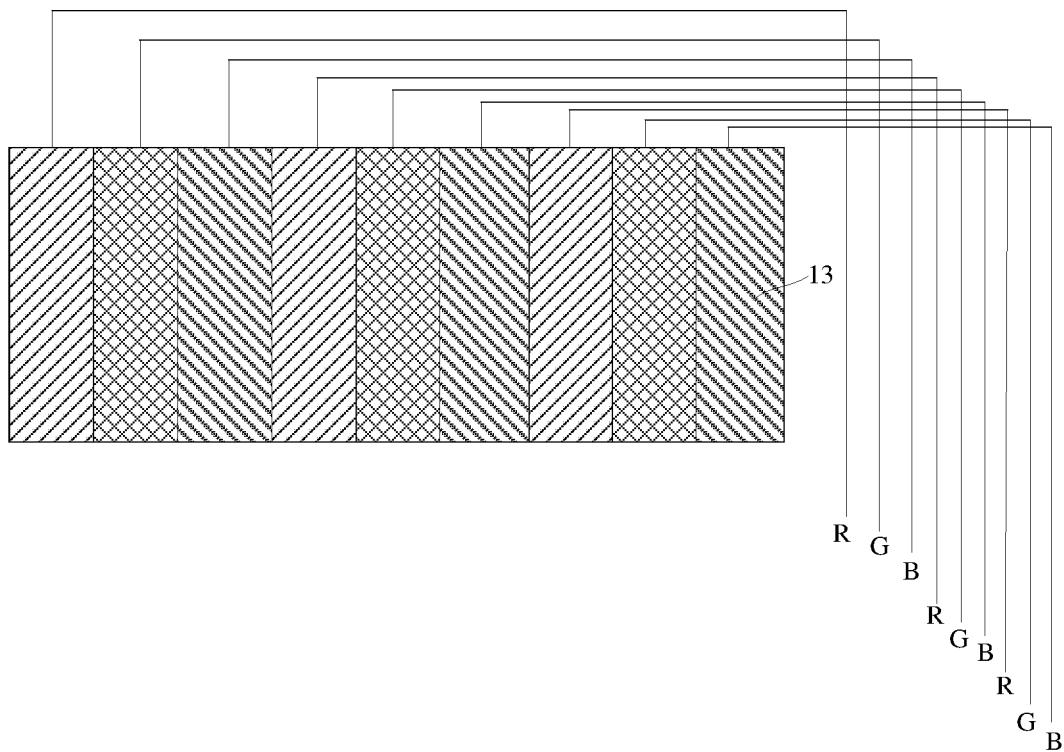
FIG. 12 is a schematic diagram of still another type of the passive driving circuit for the columns of second OLED sub-pixels in the transparent display area, in which the first electrodes in the columns of the second OLED sub-pixels in each of the second OLED pixel units are connected to different data signal channels of the display driver integrated chip.

FIG. 12 is a schematic diagram of still another type of the passive driving circuit for the columns of second OLED sub-pixels 13 in the transparent display area. In order to enable each column of the sub-pixels of the same color to be individually controlled to perform the display function or the light transmission function, as shown in FIG. 12, the first electrodes in the columns of the second OLED sub-pixels 13 in each of the second OLED pixel units may also be connected to different data signal channels of the display driver integrated chip. Since the transparent display area only has one row of the second OLED sub-pixels 13, driving currents only are to be applied to the respective columns of second OLED sub-pixels 13. The driving currents come from several data signal channels (source lines) of the display driver integrated chip (DDIC). The remaining data signal channels of the display driver integrated chip may be provided to the columns of the first OLED sub-pixels 11 in the non-transparent display area 10a, where each column of the first OLED sub-pixels 11 occupies one data signal channel.

A sum of a number of data signal channels corresponding to the columns of first OLED sub-pixels 11 in the non-transparent display area 10a and a number of data signal channels corresponding to the columns of second OLED sub-pixels 11 in the transparent display area 10b is the total number of data signal channels. Data of all data signal channels corresponds to one frame of screen display in the display area 10.

Figure 13:
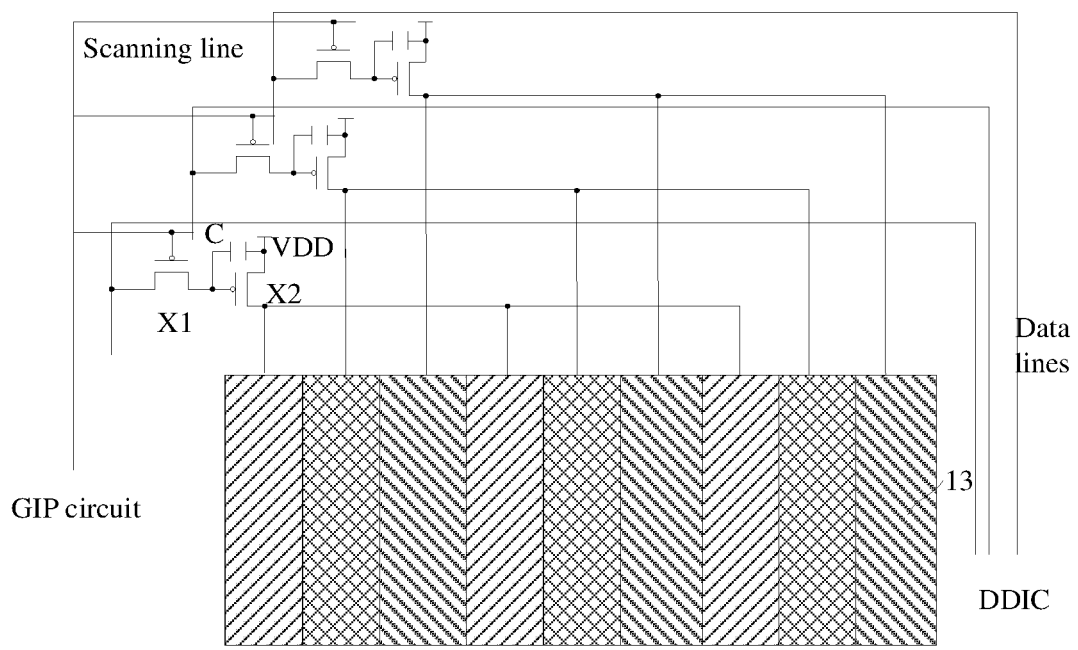
FIG. 13 is a schematic diagram of a type of an active driving circuit for the columns of second OLED sub-pixels in the transparent display area.

FIG. 13 is a schematic diagram of a type of an active driving circuit for the columns of second OLED sub-pixels 13 in the transparent display area. Referring to FIG. 13, the second electrodes in the columns of sub-pixels of a same color in respective columns of second OLED pixel units are grounded, the first electrodes in columns of the sub-pixels of the same color in respective columns of second OLED pixel units are connected to a drain of a same driving transistor in a pixel drive circuit. The gate of each driving transistor corresponds to a data signal channel of the display driver integrated chip; and the source of each driving transistor corresponds to the power supply voltage VDD. In FIG. 13, the pixel driving circuit may include a transistor array. Each transistor unit may include: a switching transistor X1, a driving transistor X2, and a storage capacitor C. That is, each transistor unit includes 2T1C. The data line in each transistor unit may be connected to a data signal channel (source line) of the display driver integrated chip (DDIC); the scanning lines of the transistor units may be jointly connected to a scanning signal channel of the GIP circuit. In other words, all the second OLED pixel units occupy three data signal channels of the display driver integrated chip and one scanning signal channel of the GIP circuit. The remaining data signal channels of the display driver integrated chip may be provided to the columns of the first OLED sub-pixels 11 in the non-transparent display area 10a, that is, each column of the first OLED sub-pixels 11 occupies one data signal channel. The remaining scanning signal channels of the GIP circuit may be provided to the rows of the first OLED sub-pixels 11 in the non-transparent display area 10a, that is, each row of the first OLED sub-pixels 11 occupies one scanning signal channel.

In other alternative examples, the second electrodes in the columns of sub-pixels of a same color in respective columns of second OLED pixel units are grounded; the first electrodes in the columns of sub-pixels of a same color in respective columns of second OLED pixel units are connected to drains of different driving transistors in a pixel drive circuit; a gate of each driving transistor corresponds to a data signal channel of the display driver integrated chip; and a source of each driving transistor corresponds to a power supply voltage VDD. The pixel driving circuit may include a transistor array including multiple transistor units corresponding to different sub-pixels. Each transistor unit may include: a switching transistor X1, a driving transistor X2, and a storage capacitor C. That is, each transistor unit includes 2T1C. The data line in each transistor unit may be connected to a data signal channel (source line) of the display driver integrated chip (DDIC); and the scanning lines of the transistor units may be jointly connected to a scanning signal channel of the GIP circuit. In other words, each of the second OLED pixel units occupies one data signal channel of the display driver integrated chip and all the second OLED pixel units jointly occupy one scanning signal channel of the GIP circuit.

A sum of the number of data signal channels corresponding to the first OLED sub-pixels 11 in the non-transparent display area 10a and a number of data signal channels corresponding to the second OLED sub-pixels 13 in the transparent display area 10b is a total number of data signal channels. Data of all data signal channels corresponds to one frame of screen display in the display area 10.

In the operation process, in addition to the 2T1C, the pixel driving circuits connected to the first electrodes of the sub-pixels 13 of the same color in each of the second OLED pixel units may be pixel driving circuits such as 6T1C, 7T1C and the like. The data line signal $V_{DATA}$ of the above pixel driving circuit may come from three or more data signal channels of the display driver integrated chip (DDIC); the signals of the scanning lines $S_{n-1}$ and $S_n$ may come from two scanning signal channels of the GIP circuit; the emission signals EM may come from an emission signal channel of the GIP circuit, and the initial signal INIT may come from a display driver integrated chip.

Figure 14:
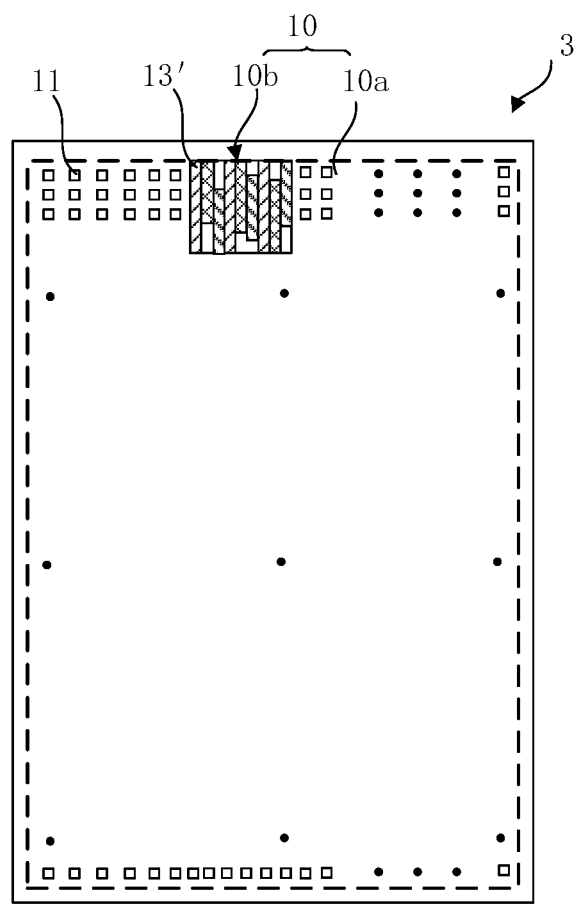
FIG. 14 is a top view of an OLED array substrate in a third example of the present disclosure, in which one or more columns of second OLED sub-pixel extend in a column direction in a middle section of the transparent display area, or extend in the column direction from a top of the transparent display area to a middle or bottom of the transparent display area, or extend in the column direction from the middle of the transparent display area to the bottom of the transparent display area.

FIG. 14 is a top view of an OLED array substrate 3 in a third example of the present disclosure. Referring to FIG. 14, the OLED array substrate 3 in this example is substantially the same as the OLED array substrates 1 and 2 in the previous examples, and the only difference is that one or more columns of second OLED sub-pixel 13' may extend in a column direction in a middle section of the transparent display area 10b, or extend in the column direction from a top of the transparent display area 10b to a middle or bottom of the transparent display area 10b, or extend in the column direction from the middle of the transparent display area 10b to the bottom of the transparent display area 10b. Unlike in the previous examples in which different intensities of driving currents are applied to the first electrodes, and/or driving currents are applied to sub-pixels of different colors to form different patterns, in this example, the columns of second OLED sub-pixels 13' of various structures may also be combined with each other to display various patterns.

The columns of second OLED sub-pixels 13' may be sub-pixels of a same color, that is, the transparent display area 10b performs a monochrome display function. The columns of second OLED sub-pixels 13' may also be sub-pixels 13' of different colors, that is, the transparent display area 10b performs a multi-color display function.

Figure 15:
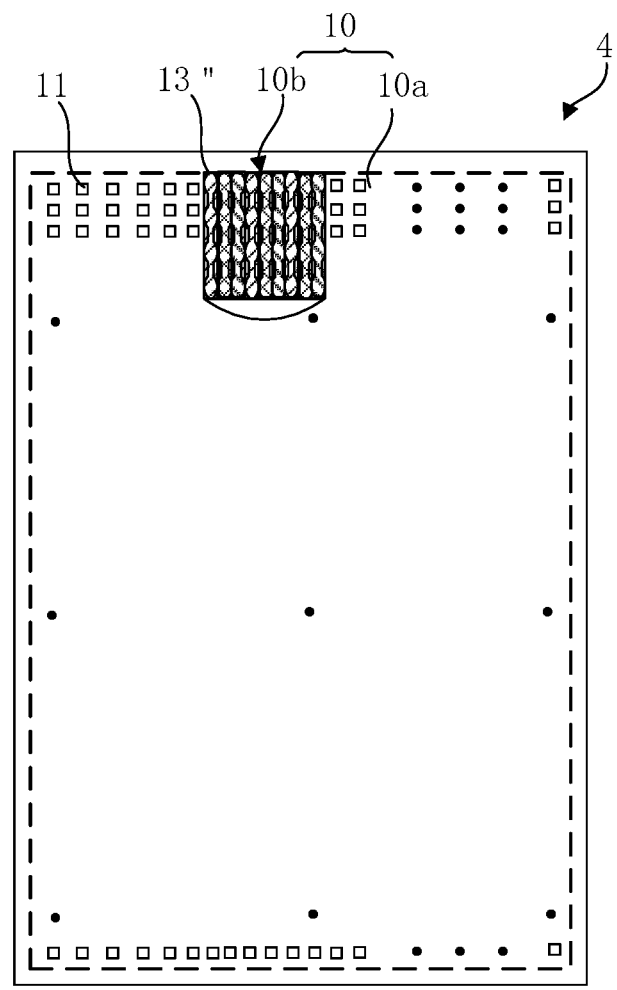
FIG. 15 is a top view of an OLED array substrate in a fourth example of the present disclosure, in which one or more, or all of the columns of second OLED sub-pixels have an "8" shape in a column direction.

FIG. 15 is a top view of an OLED array substrate 4 in a fourth example of the present disclosure. Referring to FIG. 15, the OLED array substrate 4 in this example is substantially the same as the OLED array substrates 1, 2, and 3 in the above examples, and the only difference is that one or more, or all of the columns of second OLED sub-pixels 13" have an "8" shape in a column direction. In other words, the first electrodes and the second OLED light-emitting structures of the second OLED sub-pixels 13" in one, some, or all of the columns have an "8" shape in the column direction. Relative to the second OLED sub-pixel having a rectangular shape with right-angle corners or a rectangular shape with rounded corners, the above shapes can further reduce the diffraction phenomenon during light transmission.

The columns of second OLED sub-pixels 13" may be sub-pixels of a same color, that is, the transparent display area 10b performs a monochrome display function. The columns of second OLED sub-pixels 13" in the above shape may also be sub-pixels 13" of different colors, that is, the transparent display area 10b performs a multi-color display function.

Figure 16:
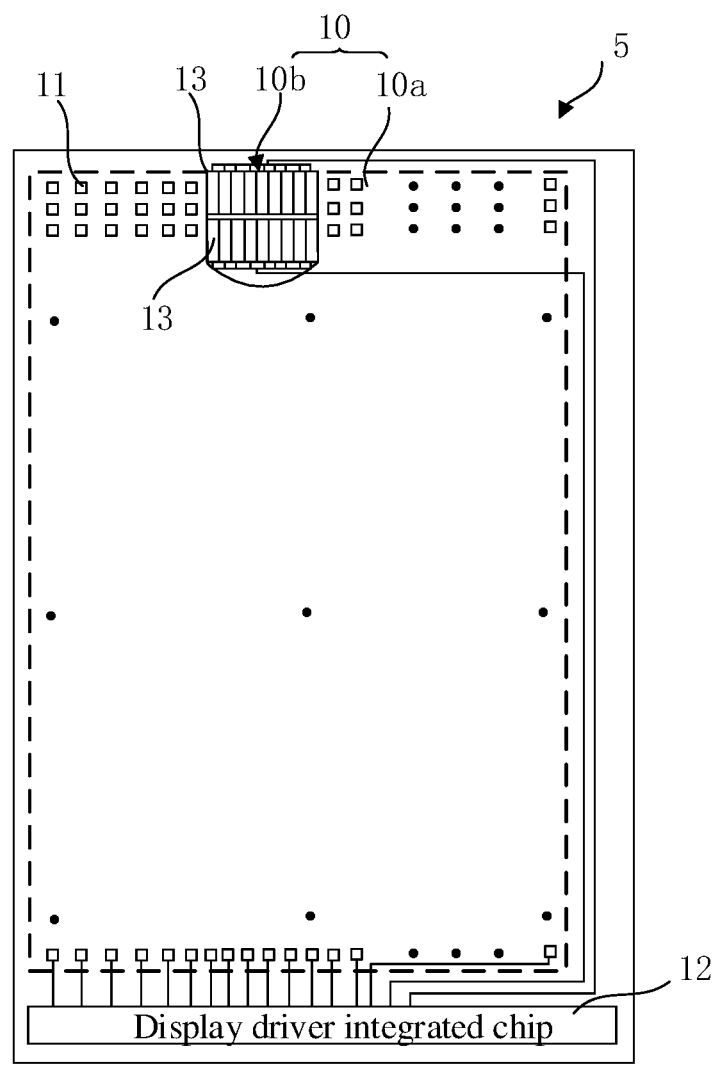
FIG. 16 is a top view of an OLED array substrate in a fifth example of the present disclosure, the second OLED sub-pixels are in two rows and several columns.

FIG. 16 is a top view of an OLED array substrate 5 in a fifth example of the present disclosure. Referring to FIG. 16, the OLED array substrate 5 in this example is substantially the same as the OLED array substrate 1 in the above example, and the only difference is that the second OLED sub-pixels 13 are in two rows and several columns.

The structure of the second OLED sub-pixels 13 in two rows and several columns can refer to the structures in the first to fourth examples above.

Figure 17:
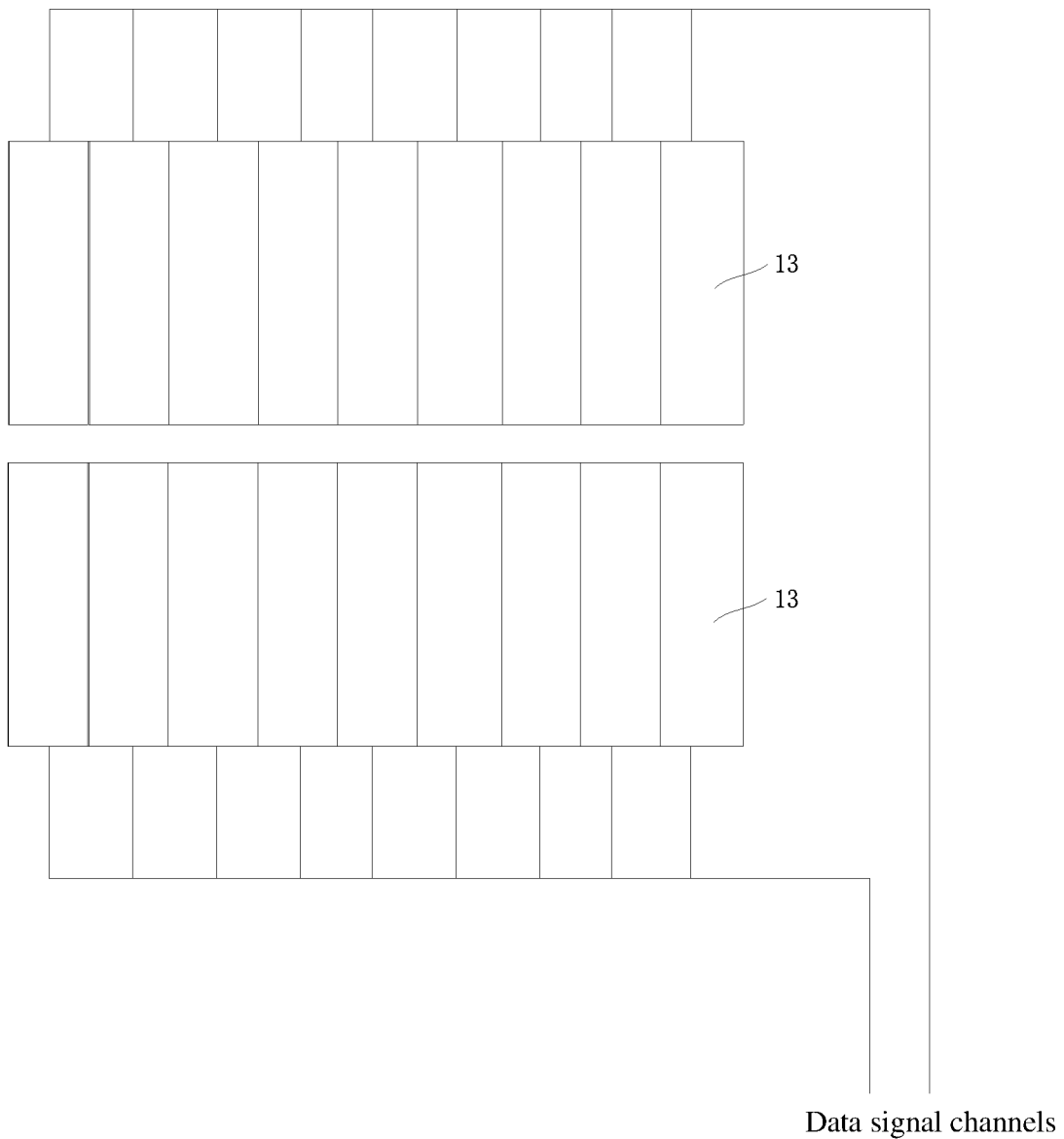
FIG. 17 is a schematic diagram of a type of a passive driving circuit for the columns of second OLED sub-pixels in two rows in the transparent display area.

FIG. 17 is a schematic diagram of a type of a passive driving circuit for the columns of second OLED sub-pixels 13 in two rows in the transparent display area. Compared with FIG. 3, as shown in FIG. 17, the first electrodes in the first row of the second OLED sub-pixels 13 are connected to a data signal channel of the display driver integrated chip 12, and the first electrodes in the second row of the second OLED sub-pixels 13 are connected to another data signal channel of the display driver integrated chip 12. The second electrodes of all the second OLED sub-pixels 13 are grounded. In other alternative examples, the first electrodes in the first and second row of the second OLED sub-pixels 13 may also be jointly connected to a same data signal channel of the display driver integrated chip 12. In this example, the display driver integrated chip 12 has a least number of channels. The wiring of the data signal channels corresponding to the first row of the second OLED sub-pixels 13 may be arranged in an edge area which is located in a peripheral area of the display area 10. The wiring of the data signal channels corresponding to the second row of the second OLED sub-pixels 13 may be arranged in a transition area between the transparent display area and the non-transparent display area. The transition area is located between the transparent display area 10b and the non-transparent display area 10a.

Figure 18:
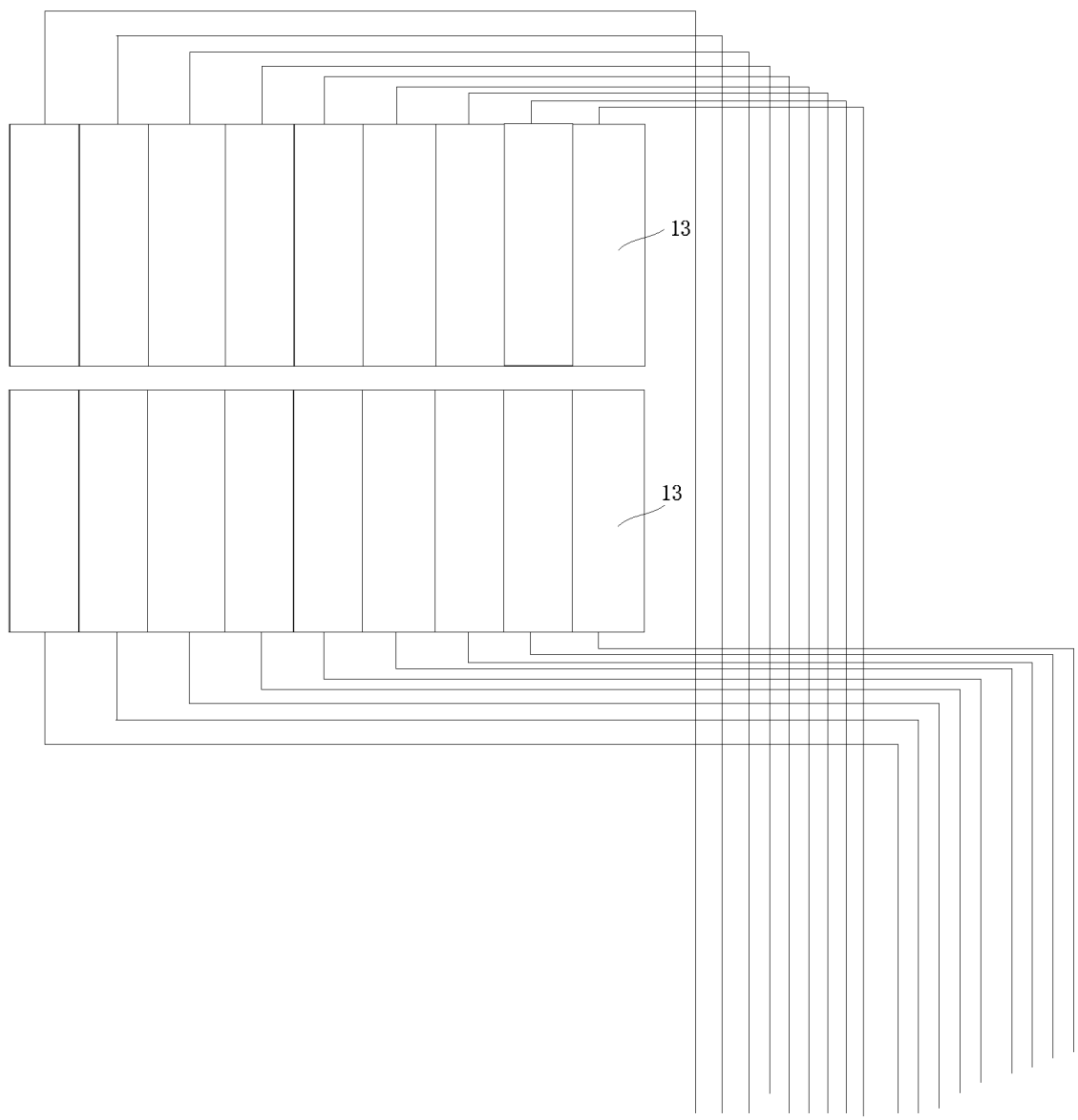
FIG. 18 is a schematic diagram of another type of the passive driving circuit for the columns of second OLED sub-pixels in two rows in the transparent display area, in which the first electrode in each column of second OLED sub-pixel in the first row is connected to a data signal channel of the display driver integrated chip, and the first electrode in each column of second OLED sub-pixel in the second row is also connected to a data signal channel of the display driver integrated chip.

FIG. 18 is a schematic diagram of another type of the passive driving circuit for the columns of second OLED sub-pixels 13 in two rows in the transparent display area. Compared with FIG. 4, the first electrode in each column of second OLED sub-pixel 13 in the first row is connected to a data signal channel of the display driver integrated chip 12, and the first electrode in each column of second OLED sub-pixel 13 in the second row is also connected to a data signal channel of the display driver integrated chip 12. In this example, the occupied number of data signal channels of the display driver integrated chip is the most.

Figure 19:
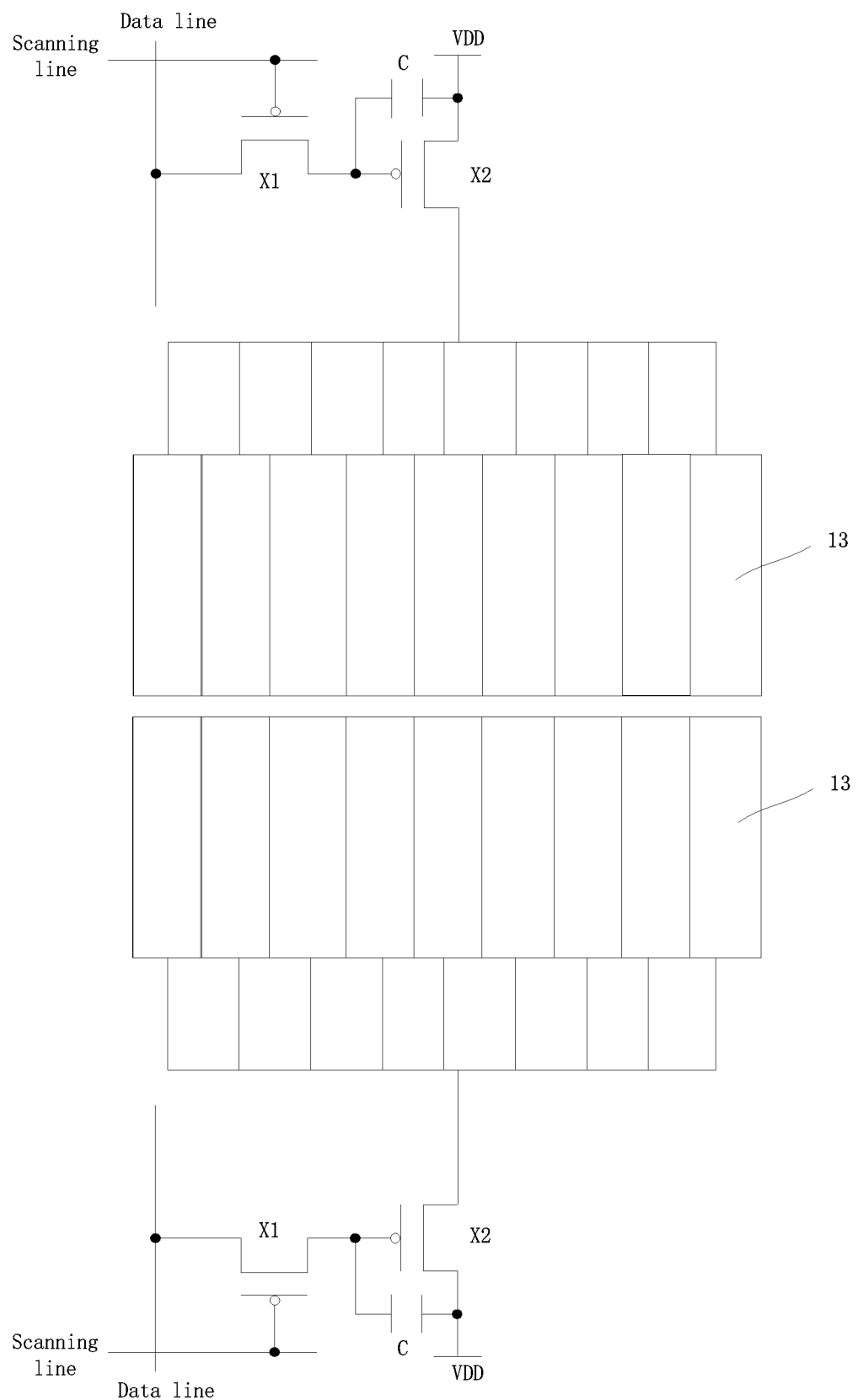
FIG. 19 is a schematic diagram of a type of an active driving circuit for the columns of second OLED sub-pixels in two rows in the transparent display area.

FIG. 19 is a schematic diagram of a type of an active driving circuit for the columns of second OLED sub-pixels 13 in two rows in the transparent display area. Compared with FIG. 5, the first electrodes in the columns of the second OLED sub-pixels 13 in the first row are connected to a drain of a driving transistor in a pixel driving circuit, and a gate of the driving transistor corresponds to a data signal channel of the display driver integrated chip 12. The first electrodes in the columns of the second OLED sub-pixels 13 in the second row are connected to a drain of a driving transistor in another pixel driving circuit, and a gate of the driving transistor corresponds to another data signal channel of the display driver integrated chip 12. The columns of the second OLED sub-pixels 13 in the first row and the columns of the second OLED sub-pixels 13 in the second row correspond to a same scanning signal channel. In other words, all the second OLED sub-pixels in the transparent display area are lighted up at one time.

The pixel driving circuit in FIG. 19 takes 2T1C as an example. In other alternative example, the pixel driving circuit may also be 3T1C, 6T1C, 7T1C, etc.

Figure 20:
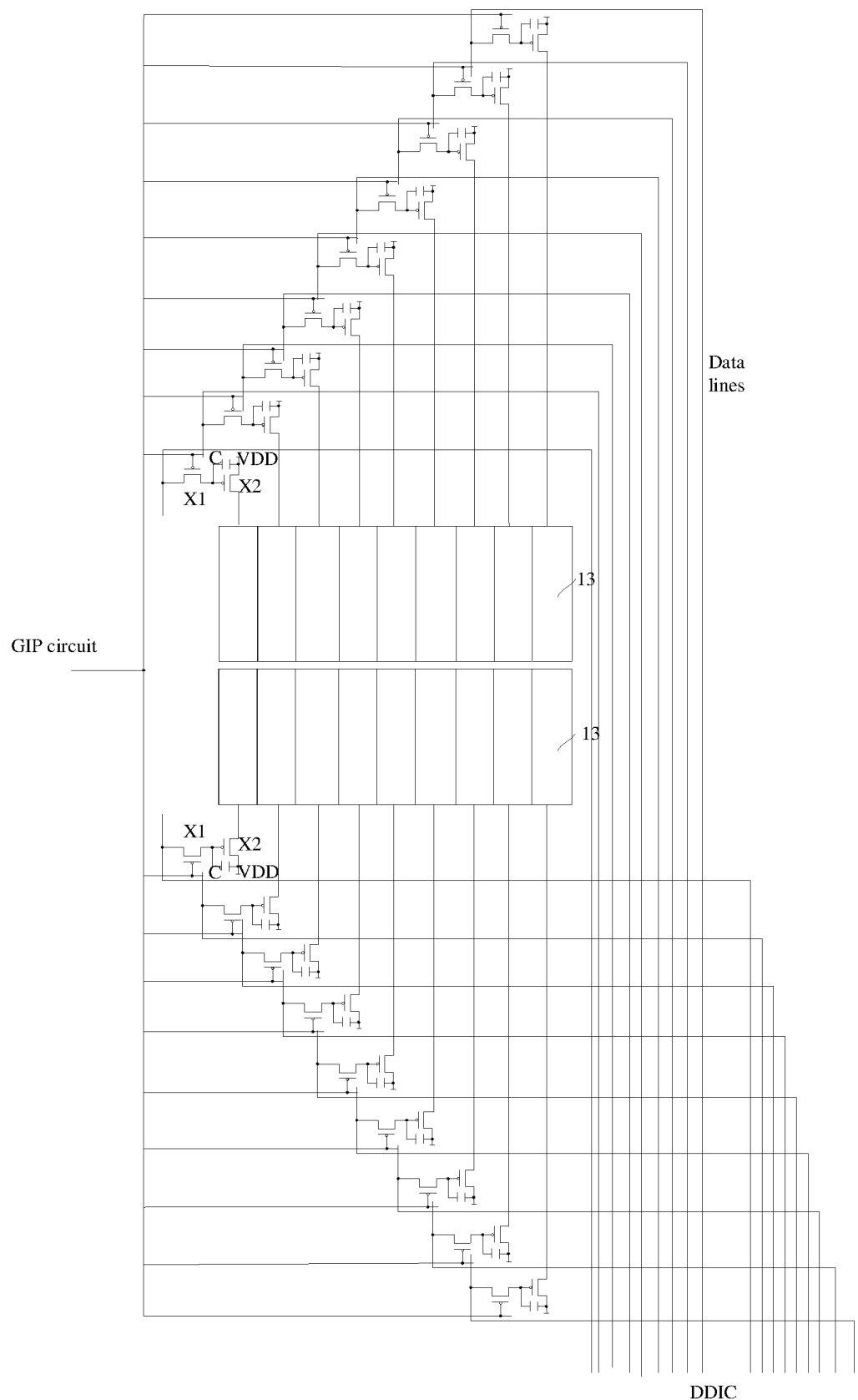
FIG. 20 is a schematic diagram of another type of the active driving circuit for the columns of second OLED sub-pixels in two rows in the transparent display area, in which the first electrode in each column of the second OLED sub-pixel in the first row is connected to a drain of a driving transistor in a pixel driving circuit, and a gate of the driving transistor corresponds to a data signal channel of the display driver integrated chip; the first electrode in each column of the second OLED sub-pixel in the second row is connected to a drain of a driving transistor in a pixel driving circuit, and a gate of the driving transistor corresponds to a data signal channel of the display driver integrated chip.

FIG. 20 is a schematic diagram of another type of the active driving circuit for the columns of second OLED sub-pixels 13 in two rows in the transparent display area. Compared with FIG. 7, the first electrode in each column of the second OLED sub-pixel 13 in the first row is connected to a drain of a driving transistor in a pixel driving circuit, and a gate of the driving transistor corresponds to a data signal channel of the display driver integrated chip 12. The first electrode in each column of the second OLED sub-pixel 13 in the second row is connected to a drain of a driving transistor in a pixel driving circuit, and a gate of the driving transistor corresponds to a data signal channel of the display driver integrated chip 12. The columns of the second OLED sub-pixels 13 in the first row and the columns of the second OLED sub-pixels 13 in the second row correspond to a same scanning signal channel. In other words, all the second OLED sub-pixels in the transparent display area are lighted up at one time.

The pixel driving circuit in FIG. 20 takes 2T1C as an example. In other alternative example, the pixel driving circuit may also be 3T1C, 6T1C, 7T1C, etc.

Referring to the driving modes of the second OLED sub-pixels 13 in FIGS. 17 to 20, the driving method for the two rows of the second OLED sub-pixels 13 in this example is equivalent to driving method for second OLED sub-pixels in one row and several columns in the previous example. The difference is that when the first and second rows are driven, the scanning signal can be shared.

In FIGS. 17 to 20, the second OLED sub-pixels 13 in the transparent display area 10b are sub-pixels of a same color. In an alternative example, the second OLED sub-pixels 13 in the transparent display area 10b may be one of red sub-pixels, green sub-pixels, blue sub-pixels, yellow sub-pixels, etc. In other words, when the transparent display area 10b performs a display function, the transparent display area emits monochromatic light.

In FIGS. 17 to 20, the columns of the second OLED sub-pixels 13 in the transparent display area 10b may be sub-pixels of different colors. When the columns of the second OLED sub-pixels 13 in the two rows are sub-pixels of different colors, the colors of an upper row sub-pixel and a lower row sub-pixel in one column are preferably the same. In this case, the first and the second row of the pixels can each corresponds to a data signal channel, or they can share a same data signal channel.

In FIGS. 17 to 20, the first electrodes and the OLED light-emitting structures in a first row of the second OLED sub-pixels 13 may extend in a column direction in a middle and upper section of the transparent display area 10b, or extend in the column direction from a top of the transparent display area 10b to a upper middle or a middle of the transparent display area 10b; the first electrodes and the OLED light-emitting structures in a second row of the second OLED sub-pixels 13 may extend in the column direction in the middle and lower sections of the transparent display area 10b, or extend in the column direction from a bottom of the transparent display area 10b to a lower middle or the middle of the transparent display area 10b.

Figure 21:
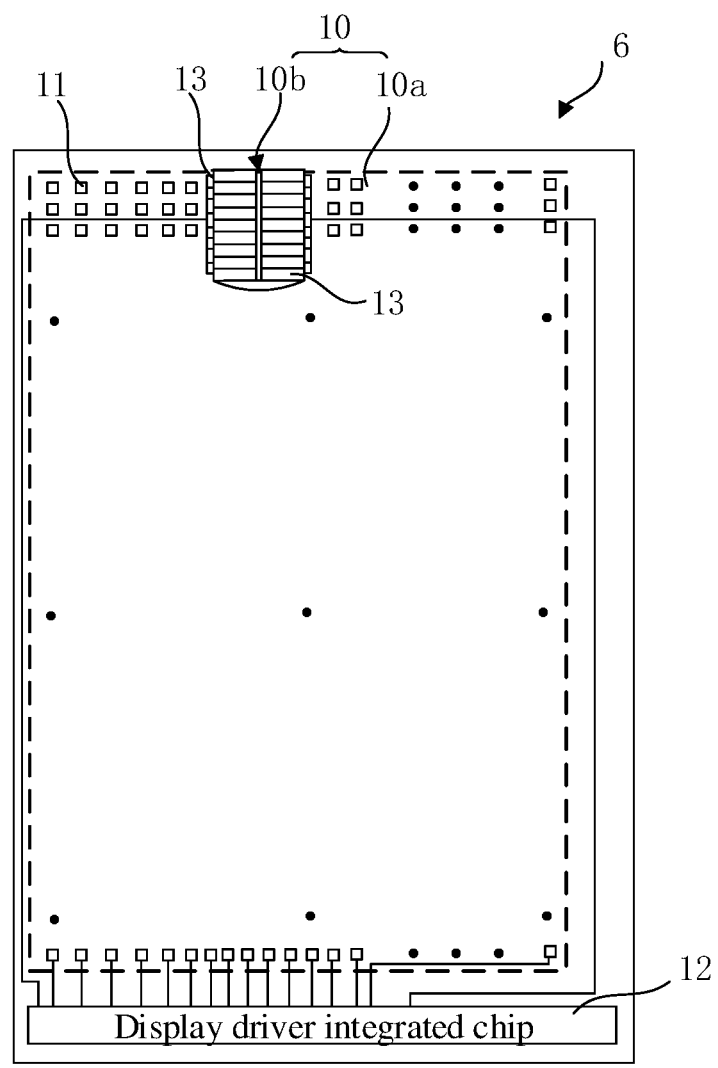
FIG. 21 is a top view of an OLED array substrate in a sixth example of the present disclosure, in which the second OLED sub-pixels are in two columns and several rows.

FIG. 21 is a top view of an OLED array substrate 6 in a sixth example of the present disclosure. Referring to FIG. 21, the OLED array substrate 6 in this example includes a display area 10, and the display area 10 includes a non-transparent display area 10a and a transparent display area 10b.

The non-transparent display area 10a includes first OLED sub-pixels 11 arranged in a first array. In a direction perpendicular to a plane where the OLED array substrate 6 is located, each of the first OLED sub-pixels 11 includes: a lower electrode, a first OLED light emitting structure disposed over the electrode and an upper electrode disposed over the first OLED light emitting structure, where the lower electrode is located on the OLED array substrate. The columns of the first OLED sub-pixels 11 are driven by a part of the data signal channels of the display driver integrated chip 12. The transparent display area 10b includes second OLED sub-pixels 13 arranged in a second array. In a direction perpendicular to the plane where the OLED array substrate 6 is located, each of the second OLED sub-pixels 13 includes: a first electrode extending in a row direction, a second OLED light emitting structure disposed over the first electrode and extending in the row direction, and a second electrode disposed over the second OLED light emitting structure. When the columns of the second OLED sub-pixels 13 in the two rows are driven, the transparent display area 10b performs a display function; when the columns of the second OLED sub-pixels 13 in the two columns and several rows are not driven, the transparent display area 10b performs a light transmission function. The rows of the second OLED sub-pixels 13 in the two columns are driven by a remaining part of the data signal channels in the same display driver integrated chip. The data of the data signal channels corresponding to the rows of the first OLED sub-pixels 1 land the second OLED sub-pixels 13 in two columns and several rows correspond to one frame of screen display in the display area 10.

Compared with the OLED array substrate 5 in the fifth example, the difference is that the second OLED sub-pixels 13 are arranged in two columns and several rows.

The first electrode of each second OLED sub-pixel 13 extends in the row direction.

Figure 22:
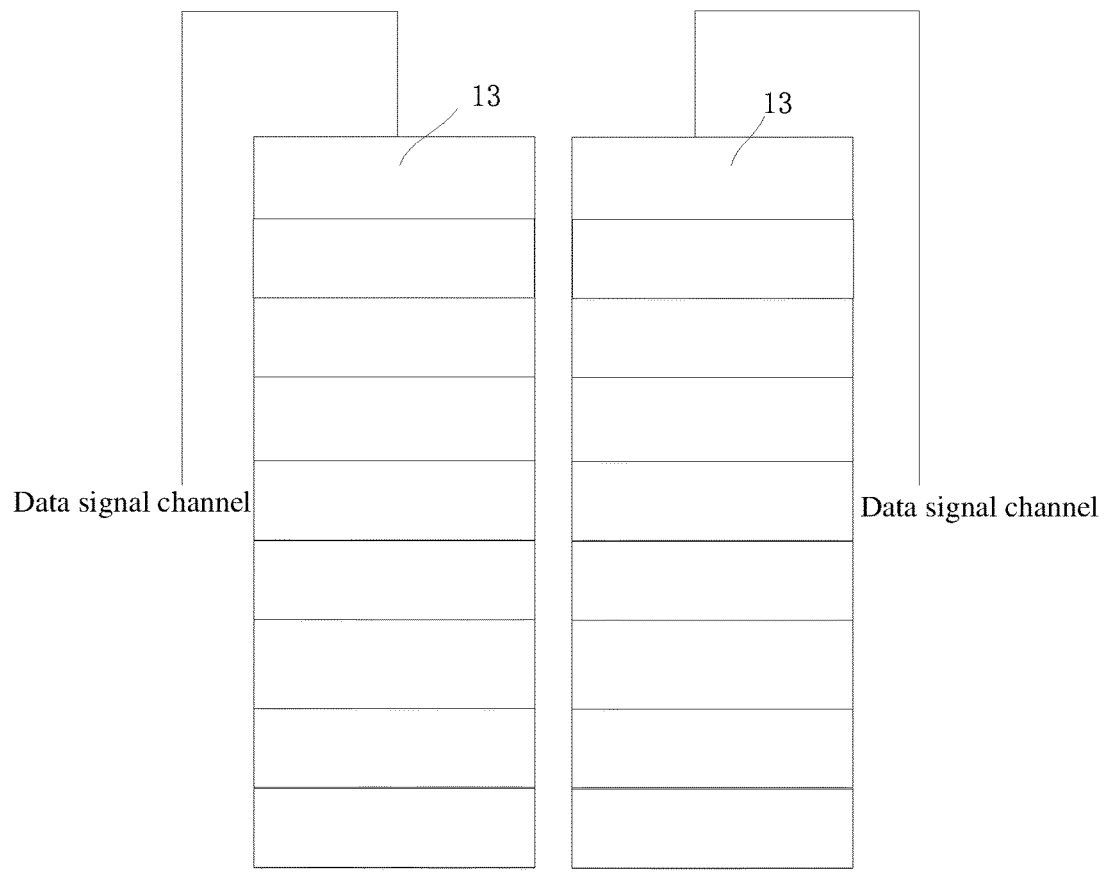
FIG. 22 is a schematic diagram of a type of a passive driving circuit for the rows of second OLED sub-pixels in two columns in the transparent display area.

FIG. 22 is a schematic diagram of a type of a passive driving circuit for the rows of second OLED sub-pixels 13 in two columns in the transparent display area. Referring to FIG. 22, the first electrodes in the rows of the second OLED sub-pixels 13 in each column are connected to a data signal channel of the display driver integrated chip. In other words, the rows of second OLED sub-pixels 13 in the two columns occupy two data signal channels.

A sum of a number of data signal channels occupied by the non-transparent display area 10a and two data signal channels occupied by the transparent display area 10b, is a total number of the data signal channels. Data of all data signal channels correspond to one frame of screen display in the display area 10.

In other alternative examples, the first electrodes in the rows of the second OLED sub-pixels 13 in each column may be connected to different data signal channels of the display driver integrated chip, or part of the first electrodes may be connected to a same data signal channel; or the first electrodes in the rows of the second OLED sub-pixels 13 in the two columns may be connected to a same data signal channel of the display driver integrated chip.

Figure 23:
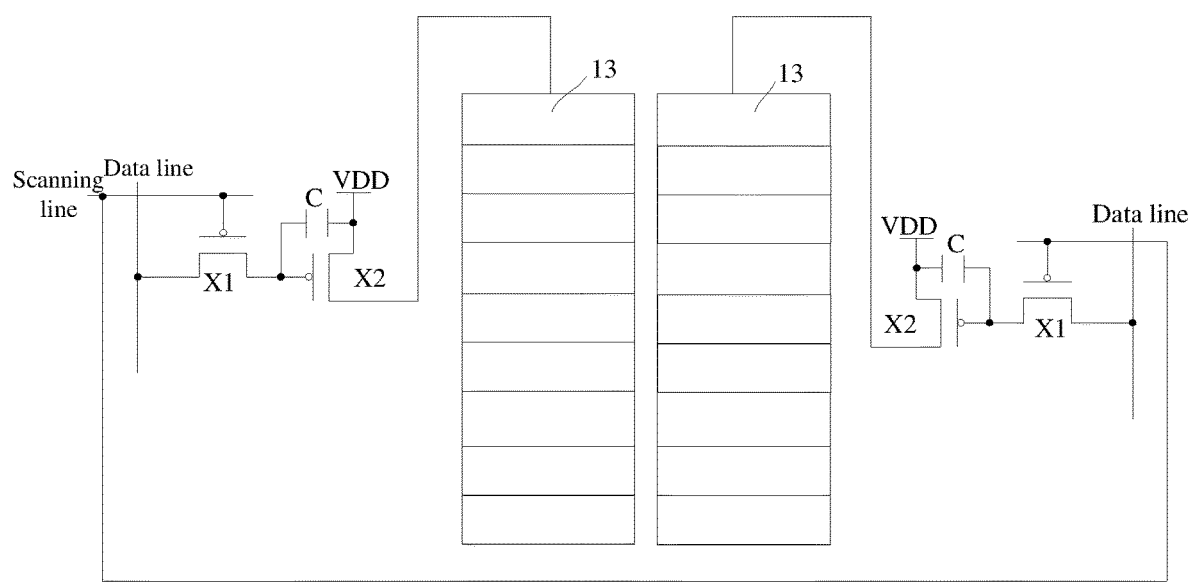
FIG. 23 is a schematic diagram of a type of an active driving circuit for the rows of second OLED sub-pixels in two columns in the transparent display area.

FIG. 23 is a schematic diagram of a type of an active driving circuit for the rows of second OLED sub-pixels 13 in two columns in the transparent display area. Referring to FIG. 23, the first electrodes in the rows of the second OLED pixels 13 in a first column are connected to a drain of a driving transistor in a same pixel driving circuit, and a gate of the driving transistor corresponds to a data signal channel of the display driver integrated chip; the first electrodes in the rows of the second OLED pixels 13 in a second column are connected to a drain of a driving transistor in another pixel driving circuit, and a gate of the driving transistor corresponds to another data signal channel of the display driver integrated chip. In other words, the transparent display area occupies two data signal channels. In other alternative examples, the first electrodes in the rows of the second OLED sub-pixels 13 in the two columns may be connected to a drain of a driving transistor in a same pixel driving circuit, and a gate of the driving transistor correspond to a same data signal channel of the display driver integrated chip. That is, the transparent display area only occupies one data signal channel. The rows of the second OLED sub-pixels 13 in the first column and the rows of the second OLED sub-pixels 13 in the second column correspond to a same scanning signal channel.

The pixel driving circuit in FIG. 23 takes 2T1C as an example. In other alternative example, the pixel driving circuit may also be 3T1C, 6T1C, 7T1C, etc.

In FIGS. 21 to 23, the columns of second OLED sub-pixels 13 in the transparent display area 10b are sub-pixels of a same color. In an alternative example, the columns of second OLED pixels 13 in the transparent display area 10b may be one of red sub-pixels, green sub-pixels, blue sub-pixels, yellow sub-pixels, etc. In other words, when the transparent display area 10b performs a display function, the transparent display area 10b emits monochromatic light. When the rows of the second OLED sub-pixels 13 in the two columns are sub-pixels of different colors, in one row, the colors of a sub-pixel at left and a sub-pixel at right are preferably the same.

Figure 24:
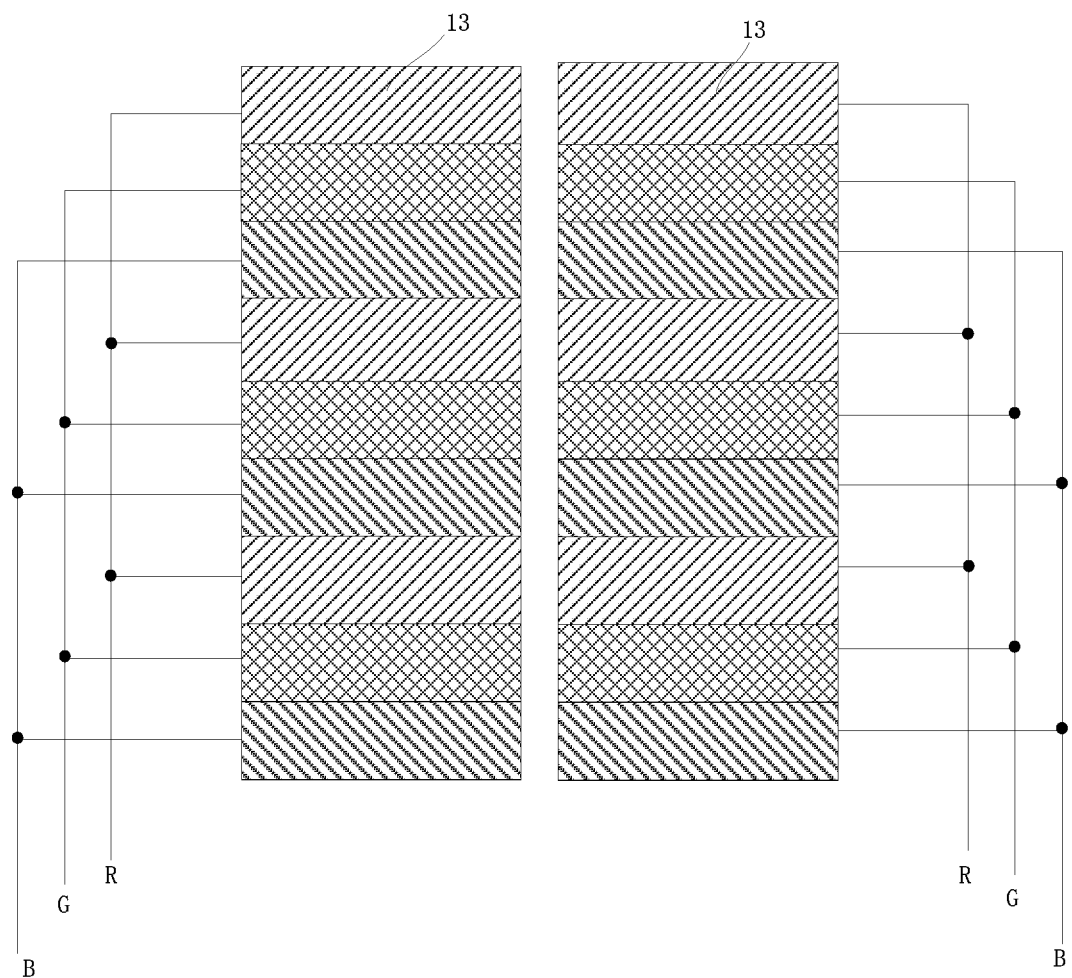
FIG. 24 is a schematic diagram of a type of another passive driving circuit for the rows of second OLED sub-pixels in two columns in the transparent display area, in which the rows of the second OLED sub-pixels in two columns are sub-pixels of different colors.

FIG. 24 is a schematic diagram of a type of a passive driving circuit for the rows of second OLED sub-pixels 13 in two columns in the transparent display area. Referring to FIG. 24, the rows of the second OLED sub-pixels 13 in two columns are sub-pixels of different colors, several adjacent columns of the second OLED sub-pixels 13 of different colors form a second OLED pixel unit. The first electrodes in the rows of the sub-pixels of a same color in each of the second OLED pixel units in each column are connected to a same data signal channel of the display driver integrated chip.

In other alternative examples, the first electrode in each of the sub-pixels of a same color in each of the second OLED pixel units in each column may be connected to a data signal channel of the display driver integrated chip; or the first electrodes in the rows of the sub-pixels of a same color in each of the second OLED pixel units in the two columns may be connected to a same data signal channel of the display driver integrated chip.

Figure 25:
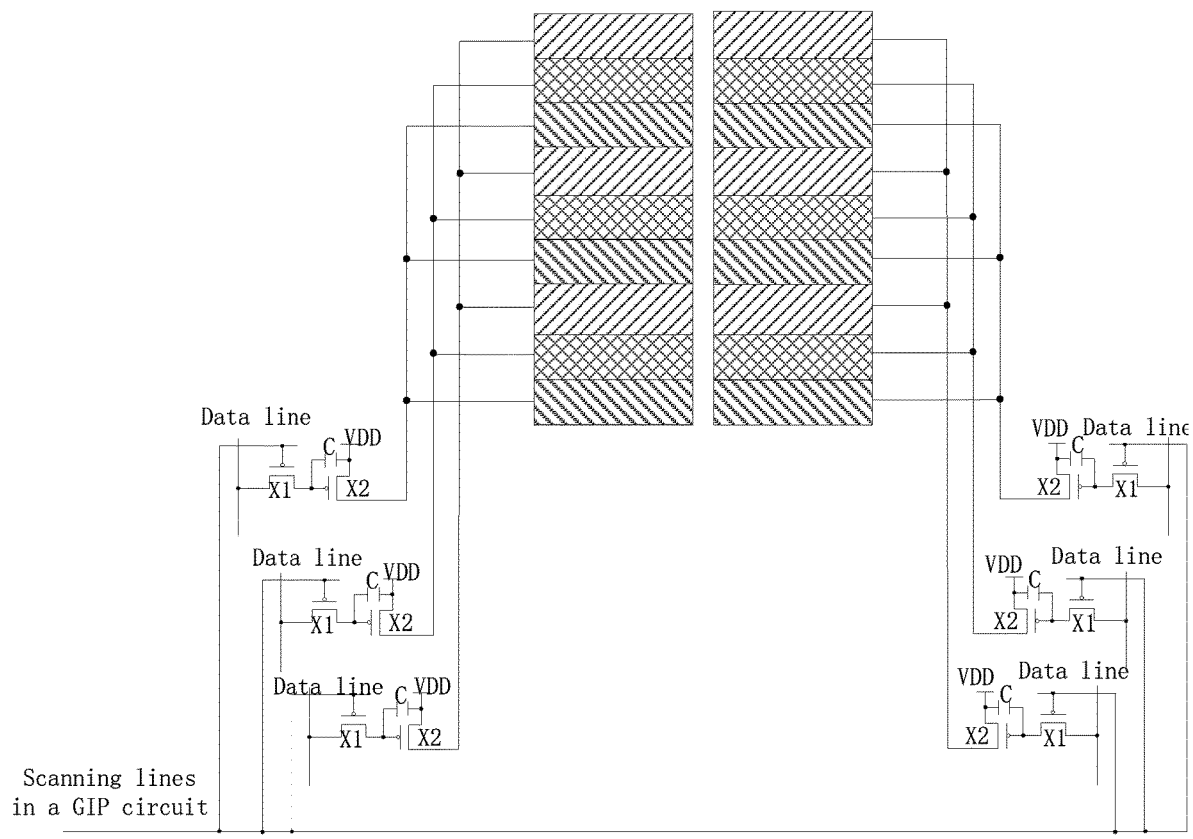
FIG. 25 is a schematic diagram of a type of another active driving circuit for the rows of second OLED sub-pixels in two columns in the transparent display area, in which the rows of the second OLED sub-pixels 13 in the two columns are sub-pixels of different colors.

FIG. 25 is a schematic diagram of a type of an active driving circuit for the rows of second OLED sub-pixels 13 in two columns in the transparent display area. Referring to FIG. 25, the rows of the second OLED sub-pixels 13 in the two columns are sub-pixels of different colors, and the first electrodes in the rows of sub-pixels of a same color in each of the second OLED pixel units in each column are connected to a drain of a driving transistor in a same pixel driving circuit, and a gate of the driving transistor corresponds to a data signal channel of the display driver integrated chip. In an alternative example, the first electrodes in the rows of the second OLED sub-pixels 13 of a same color in each of the second OLED pixel units in each column may be connected to drains of driving transistors in different pixel driving circuits, and a gate of each driving transistor corresponds to a data signal channel of the display driver integrated chip. In an alternative example, the first electrodes in the rows of the second OLED sub-pixels 13 in each of the second OLED pixel units in the two columns may be connected to a drain of a driving transistor in a same pixel driving circuits, and a gate of the driving transistor corresponds to a data signal channel of the display driver integrated chip.

The pixel driving circuit in FIG. 25 takes 2T1C as an example. In other alternative example, the pixel driving circuit may also be 3T1C, 6T1C, 7T1C, etc.

Figure 26:
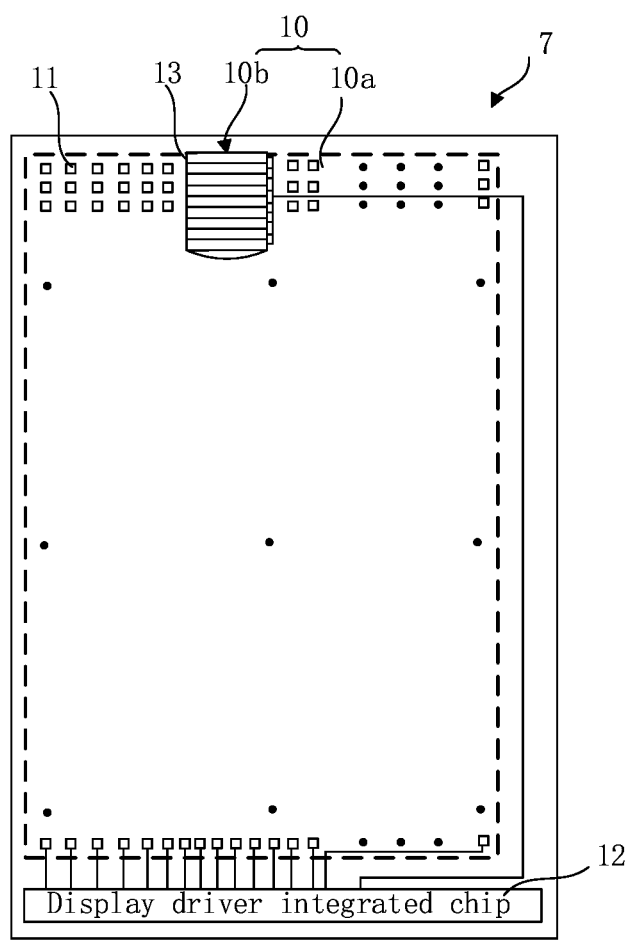
FIG. 26 is a top view of an OLED array substrate in a seventh example of the present disclosure, compared with the OLED array substrate in FIG. 21, in the OLED array substrate of this example, the second OLED sub-pixels 13 in the first or second column are omitted.

FIG. 26 is a top view of an OLED array substrate 7 in a seventh example of the present disclosure. Referring to FIG. 26, compared with the OLED array substrate 6 in FIG. 21, in the OLED array substrate 7 of this example, the second OLED sub-pixels 13 in the first or second column are omitted, and the first or second column of the second OLED sub-pixels 13 that is not omitted extend towards left and right. Correspondingly, for the structure of the second OLED sub-pixels 13, please refer to the structure of the second OLED sub-pixels in FIG. 21. Concerning the driving, the driving of the omitted column of the second OLED sub-pixels 13 in FIGS. 22 to 25 is also discarded.

Based on the aforementioned OLED array substrates, the present disclosure also provides a display panel further provided with an encapsulation layer on the basis of the aforementioned OLED array substrates. In addition to being used as a display component, the display panel may also be provided with a touch layer therein so as to be used as a touch panel. The display panel may also, as a semi-finished product, be integrated or assembled with other components to form a display device such as a mobile phone, a tablet computer, or a car display screen.

In the display device, a light sensor may be provided under the transparent display area 10b of the display panel. The light sensor includes: one or more of a camera, an iris recognition sensor, and a fingerprint recognition sensor.

Although the present disclosure is disclosed as above, the present disclosure is not limited to the above disclosure. Any person skilled in the art can make various changes and modifications without departing from the spirit and scope of the present disclosure. Therefore, the protection scope of the present disclosure shall be subject to the scope defined by the claims.

The invention claimed is:

1. An OLED array substrate, comprising:
   a display area,
   a non-transparent display area in which first OLED sub-pixels are arranged in a first array;
   a transparent display area in which second OLED sub-pixels are arranged in a second array;
   wherein the first OLED sub-pixels are driven by a part of data signal channels of a display driver integrated chip, the second OLED sub-pixels are driven by a remaining part of the data signal channels of the display driver integrated chip, and data of all the data signal channels correspond to a frame of screen display in the display area; and
   when the second OLED sub-pixels are driven, the transparent display area performs a display function; when the second OLED sub-pixels are not driven, the transparent display area performs a light transmitting function,
   wherein in a direction perpendicular to a plane where the OLED array substrate is located, each of the first OLED sub-pixels comprises: a lower electrode, a first OLED light emitting structure disposed over the lower electrode, and an upper electrode disposed over the first OLED light emitting structure; and
   in a direction perpendicular to the plane where the OLED array substrate is located, each of the second OLED sub-pixels comprises: a first electrode, a second OLED light emitting structure disposed over the first electrode and extending along the first electrode, and a second electrode disposed over the second OLED light emitting structure,
   wherein the second OLED sub-pixels comprise sub-pixels of different colors, a plurality of adjacent columns of the second OLED sub-pixels of different colors in one row form a second OLED pixel unit; a driving mode for the second OLED sub-pixels is active; and
   the first electrodes of the sub-pixels of a same color in the columns of one row are connected to a drain of a switching transistor in a same pixel driving circuit or drains of switching transistors in different pixel driving circuits, a gate of each of the driving transistors corresponds to a data signal channel of the display driver integrated chip.

2. The OLED array substrate of claim 1, wherein, the second OLED sub-pixels arranged in the second array comprise one row and several columns or two rows and several columns of the second OLED sub-pixels; and
   when the second OLED sub-pixels arranged in the second array comprise one row and several columns of the second OLED sub-pixels, colors of the second OLED sub-pixels in a same column are identical.

3. The OLED array substrate of claim 1, wherein a driving mode for the second OLED sub-pixels is active, and the OLED array substrate further comprises at least one pixel driving circuit corresponding to the second OLED sub-pixels.

4. The OLED array substrate of claim 3, wherein the OLED array substrate further comprises an edge area and a transition area, the edge area is located in a peripheral area of the display area, and the transition area is located between the transparent display area and the non-transparent display area; and the pixel driving circuits are arranged in the non-transparent display area, the edge area or the transition area.

5. The OLED array substrate of claim 1, wherein the second OLED sub-pixels are sub-pixels of a same color, a driving mode for the second OLED sub-pixels is passive, and first electrodes of the second OLED sub-pixels in one row are connected to a same data signal channel or different signal channels of the display driver integrated chip.

6. The OLED array substrate of claim 1, wherein the second OLED sub-pixels comprise sub-pixels of different colors, a plurality of adjacent columns of the second OLED sub-pixels of different colors in one row form a second OLED pixel unit; and a driving mode for the second OLED sub-pixels is passive; first electrodes of the second OLED sub-pixels of a same color in the columns of one row are connected to a same data signal channel or different data signal channels of the display driver integrated chip.

7. The OLED array substrate of claim 1, wherein the second OLED sub-pixels are sub-pixels of a same color, a driving mode for the second OLED sub-pixels is active, the first electrodes of the second OLED sub-pixels are connected to a drain of a same or multiple driving transistors in a pixel driving circuit, and a gate of the driving transistor correspond to a same or multiple data signal channels of the display driver integrated chip.

8. The OLED array substrate of claim 7, wherein the pixel driving circuit corresponding to the second OLED sub-pixels has a function of compensating a threshold voltage for the driving transistor.

9. The OLED array substrate of claim 7, wherein switching signals for the pixel driving circuit corresponding to the second OLED sub-pixels come from a part of scanning signal channels of a GIP circuit, and switching signals for a pixel driving circuit corresponding to the first OLED sub-pixels come from a remaining part of the scanning signal channels of the same GIP circuit.

10. The OLED array substrate of claim 1, wherein the pixel driving circuits corresponding to the second OLED sub-pixels have a function of compensating a threshold voltage for the driving transistors.

11. The OLED array substrate of claim 1, wherein switching signals for the pixel driving circuits corresponding to the second OLED sub-pixels come from a part of scanning signal channels of a gate in panel circuit, and switching signals for a pixel driving circuit corresponding to the first OLED sub-pixels come from a remaining part of the scanning signal channels of the same GIP circuit.

12. The OLED array substrate of claim 1, wherein second electrodes of the second OLED sub-pixels form a planar electrode, and/or upper electrodes of the first OLED sub-pixels and the second electrodes of the second OLED sub-pixels are connected as a planar electrode.

13. The OLED array substrate of claim 1, wherein when the second OLED sub-pixels arranged in the second array comprise one row and several columns of the second OLED sub-pixels; the first electrodes and the second OLED light emitting structures of the columns of the second OLED sub-pixels extend in the column direction in a middle section of the transparent display area, or extend from a top of the transparent display area to a middle or bottom of the transparent display area in the column direction, or extend from the middle of the transparent display area to the bottom of the transparent display area in the column direction.

14. The OLED array substrate of claim 1, wherein when the second OLED sub-pixels arranged in the second array comprise two rows and several columns of the second OLED sub-pixels, the first electrodes and the OLED light-emitting structures in a first row of the second OLED sub-pixels extend in a column direction in upper and middle sections of the transparent display area, or extend in the column direction from a top of the transparent display area to an upper middle or a middle of the transparent display area; and the first electrodes and the OLED light-emitting structures in a second row of the second OLED sub-pixels extend in the column direction in lower and middle sections of the transparent display area, or extend in the column direction from a bottom of the transparent display area to a lower middle or the middle of the transparent display area.

15. A display panel comprising the OLED array substrate of claim 1.

16. A display device comprising the display panel of claim 15.

17. An OLED array substrate, comprising:

a display area,
  a non-transparent display area in which first OLED sub-pixels are arranged in a first array;
  a transparent display area in which second OLED sub-pixels are arranged in a second array;
  wherein the first OLED sub-pixels are driven by a part of data signal channels of a display driver integrated chip, the second OLED sub-pixels are driven by a remaining part of the data signal channels of the display driver integrated chip, and data of all the data signal channels correspond to a frame of screen display in the display area; and
  when the second OLED sub-pixels are driven, the transparent display area performs a display function; when the second OLED sub-pixels are not driven, the transparent display area performs a light transmitting function,
  wherein in a direction perpendicular to a plane where the OLED array substrate is located, each of the first OLED sub-pixels comprises: a lower electrode, a first OLED light emitting structure disposed over the lower electrode, and an upper electrode disposed over the first OLED light emitting structure; and
  in a direction perpendicular to the plane where the OLED array substrate is located, each of the second OLED sub-pixels comprises: a first electrode, a second OLED light emitting structure disposed over the first electrode and extending along the first electrode, and a second electrode disposed over the second OLED light emitting structure,
  wherein the second OLED sub-pixels comprise sub-pixels of different colors, a plurality of adjacent columns of the second OLED sub-pixels of different colors in one row form a second OLED pixel unit; a driving mode for the second OLED sub-pixels is passive; and
  the first electrode of the second OLED sub-pixel in each column of one row is connected to a drain of a switching transistor, sources of switching transistors of the sub-pixels of a same color in the columns in different second OLED pixel units are connected to a same data signal channel of the display driver integrated chip, and gates of the switching transistors are connected to a same or different switching signals.

* * * * *